(12) United States Patent
Wessendorf et al.

(10) Patent No.: US 11,722,106 B1
(45) Date of Patent: Aug. 8, 2023

(54) MULTIFUNCTIONAL RF LIMITING AMPLIFIER

(71) Applicant: National Technology & Engineering Solutions of Sandia, LLC, Albuquerque, NM (US)

(72) Inventors: Kurt O. Wessendorf, Albuquerque, NM (US); Darren W. Branch, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 446 days.

(21) Appl. No.: 16/952,745

(22) Filed: Nov. 19, 2020

Related U.S. Application Data

(60) Provisional application No. 62/967,677, filed on Jan. 30, 2020.

(51) Int. Cl.
    *H03F 3/193*     (2006.01)
    *H03D 7/12*     (2006.01)
    *G01N 29/02*     (2006.01)

(52) U.S. Cl.
    CPC ........... *H03F 3/193* (2013.01); *G01N 29/022* (2013.01); *H03D 7/12* (2013.01); *G01N 2291/0215* (2013.01); *H03F 2200/451* (2013.01)

(58) Field of Classification Search
CPC .............. H03F 3/193; H03F 2200/451; G01N 29/022; H03D 7/12
See application file for complete search history.

(56) References Cited

U.S. PATENT DOCUMENTS

| | | | | |
|---|---|---|---|---|
| 3,805,162 | A * | 4/1974 | Hoffmann | H03D 7/12 455/343.1 |
| 7,315,211 | B1 * | 1/2008 | Lee | H03F 1/0227 330/285 |
| 2017/0170789 | A1 * | 6/2017 | Sasaki | H03F 1/56 |
| 2018/0358933 | A1 * | 12/2018 | Matsui | H03F 3/72 |
| 2020/0195210 | A1 * | 6/2020 | Tanaka | H03F 1/302 |
| 2020/0204119 | A1 * | 6/2020 | Roberts | H03F 3/195 |

OTHER PUBLICATIONS

Mujahid, A. et al., "Surface Acoustic Wave (SAW) for Chemical Sensing Applications of Recognition Layers," Sensors (2017) 17:2716, 26 pages.

* cited by examiner

*Primary Examiner* — Francis C Gray
(74) *Attorney, Agent, or Firm* — Mark A. Dodd

(57) ABSTRACT

Multifunctional RF limiting amplifiers having various configurations and functions are disclosed. In a first configuration, the RF limiting amplifier includes an active load output circuit that allows one to adjust the output impedance based upon the anticipated connected load impedance. In a second configuration, the RF limiting amplifier includes a pair of emitter-followers to buffer the output of a first stage, allowing the RF limiting amplifier to drive one or more second stages. A third configuration includes a pair of RF limiting amplifiers with their outputs mixed to implement a down conversion function. The third configuration may be used to drive dual SAW resonators for detecting the presence of biological or chemical agents. The RF limiting amplifier may be implemented in either bipolar junction transistors or CMOS transistors.

20 Claims, 11 Drawing Sheets

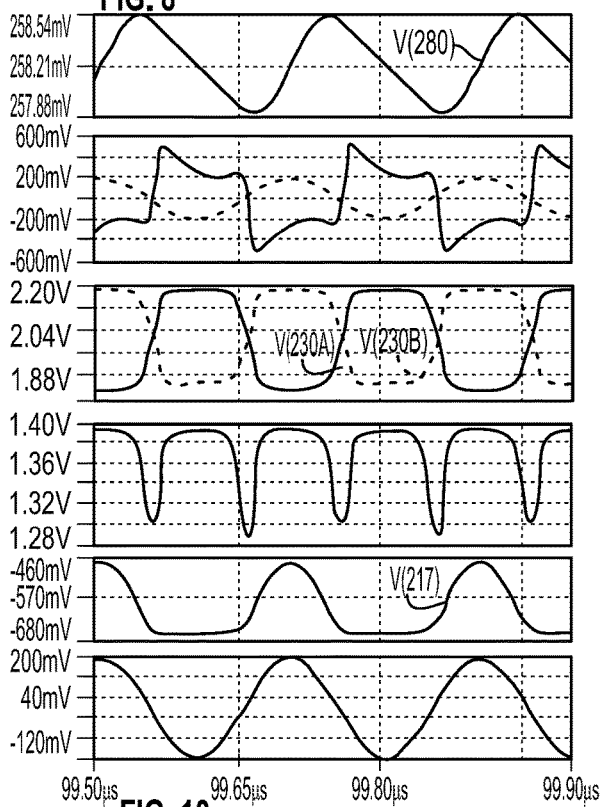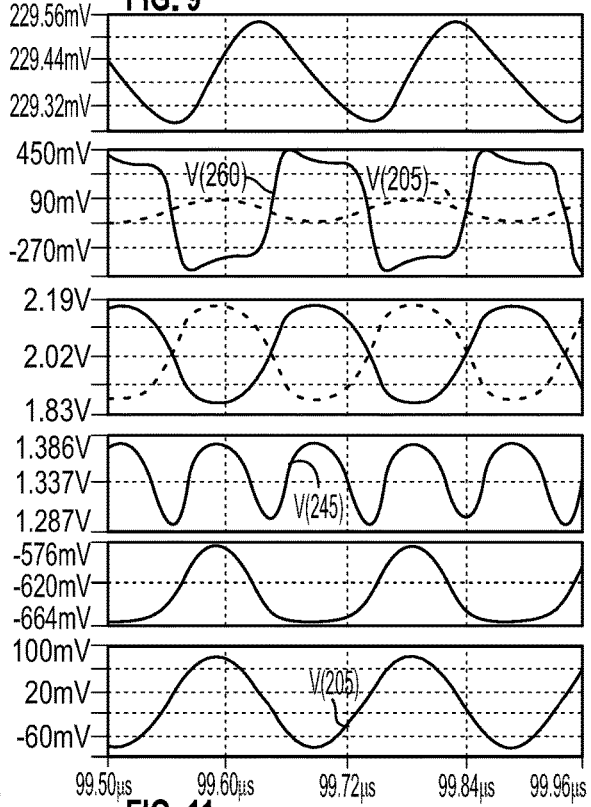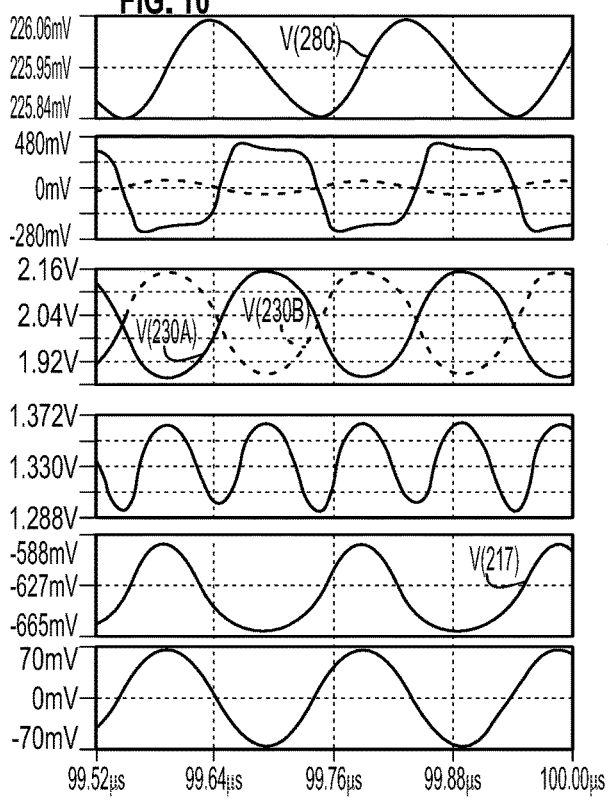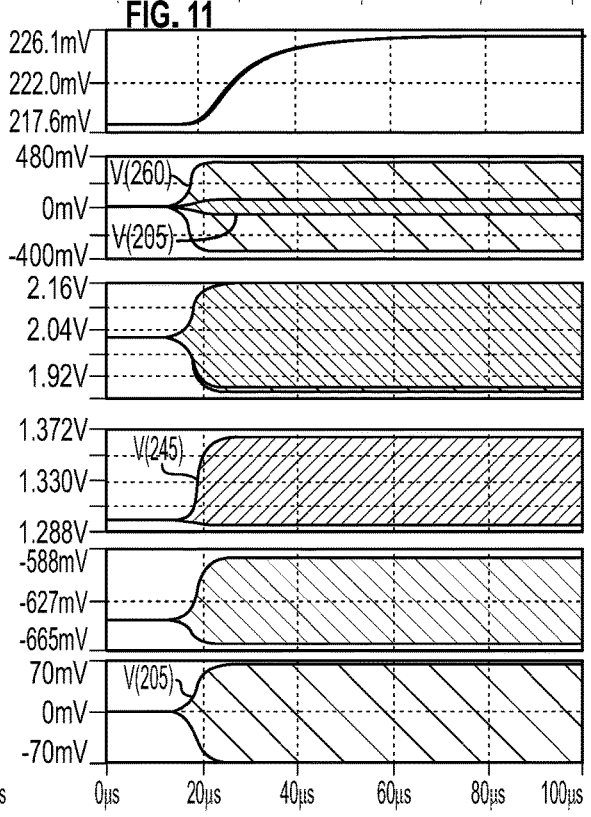

MULTIFUNCTIONAL RF LIMITING AMPLIFIER

RELATED APPLICATIONS

This application claims priority to U.S. Provisional Application No. 62/967,677, filed on Jan. 30, 2020, and entitled MULTIFUNCTIONAL RF LIMITING AMPLIFIER, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a radio frequency (RF) limiting amplifier that provides a wide range of gain, output impedance control, and output voltage limiting, while also including a monitor output that provides a nominally dc output that is proportional to the AC input amplitude.

BACKGROUND

A limiting amplifier is typically a linear amplifier until its input voltage becomes large enough that its output saturates at a predetermined limiting output voltage. Once the limiting amplifier reaches its predetermined limiting output voltage, the amplifier will limit its output regardless of any further increases in the input voltage. A limiting amplifier may find use in applications where the amplifier load is sensitive to signals greater than a specified voltage, i.e., the limiting amplifier serves to protect the load from being over-driven. To this end, one can employ a limiting amplifier having the requisite limiting output voltage to thereby limit the voltage, hence power delivered to the load. A limiting amplifier may also find use in applications where the load is very sensitive to changes in operating temperature. In these situations, limiting the drive voltage to the load minimizes signal induced temperature effects in the load, this being the case with potential sensor applications where the sensor or species being measured has a temperature sensitivity.

Most limiting amplifiers provide a symmetrical waveform around the output bias voltage of the design. It can also be advantageous that the limiting amplifier provides a minimal phase shift versus input amplitude. The limiting amplifier will remain linear until a desired threshold where the output begins limiting and subsequently provides a near square wave output as the input amplitude increases further.

A two-stage limiting amplifier 100 is known in the prior art, as illustrated in FIG. 1A. In this two-stage limiting amplifier 100, the first stage 105 provides independent gain control, with the emitter of one of the first stage transistors 110 rectifying the input voltage signal 115. Because the input impedance of the first stage transistors 110 is relatively high (much greater than 50Ω), the values of the base bias resistors 117 are set to the desired input impedance. The second stage 120 also provides gain control, but additionally limits the output voltage signal available at the output port 125 and sets the output impedance. The gain, limiting output voltage, and output impedance are all controlled by the emitter currents of the second stage transistors 130, 140 and the value of the resistor 135.

This two-stage limiting amplifier 100 has a single ended output leading to one output port 125 located between the resistor 135 and the collector of one of the second stage transistors 130. As such, the collector of the other second stage transistor 140 is connected to the positive supply voltage rail 145 and any potential use of the current in the collector of the other second stage transistor 140 is wasted as it does not help to drive a load connected to the output port 125.

Another prior art two-stage limiting amplifier 150, as illustrated in FIG. 1B, has a dual ended output, and thus a positive output port 155 and a negative output port 160. In this dual ended output two-stage limiting amplifier 150, the collectors of the second stage transistors 165, 170 are connected to the positive supply voltage rail 145 via corresponding first and second resistors 175, 180.

Both of these two-stage limiting amplifiers, when used to drive a single point load, suffer some inefficiencies as both collectors in the output stage are not contributing current to the load. This means that the output stage is only half as efficient as it could theoretically be, as one side of the differential amplifier current is simply going to the power supply. If the load has a typical RF impedance of 50Ω, then the amplifier output impedance should match the load impedance. Thus, the need exists for an RF limiting amplifier that is efficient and provides wide adjustability of gain, output impedance, and output voltage limiting.

SUMMARY

One aspect of the present invention relates to a two-stage multifunctional RF limiting amplifier having an output stage incorporating an active load output circuit, resulting in improved efficiency while allowing control of the variable gain, output impedance, and output voltage limiting. Another aspect of the present invention relates to a multifunctional RF limiting amplifier with both an active load output circuit and a pair of emitter-followers to buffer the output of the first stage, thereby allowing the limiting amplifier to drive one or more second stages. Yet another aspect of the present invention relates to a pair of multifunctional RF limiting amplifiers with their outputs mixed to implement a down conversion function.

In at least one embodiment of the present invention, a limiting amplifier comprises (1) a first stage including a pair of first stage transistors (a first of the pair of first stage transistors receiving an input voltage signal), a first stage positive supply voltage network electrically coupled to the pair of first stage transistors, and a first stage negative supply voltage network electrically coupled to the pair of first stage transistors, wherein the first stage amplifies the received input voltage signal and transmits the amplified input voltage signal as a pair of first stage output voltage signals, and (2) a second stage including a pair of second stage transistors (each of the pair of second stage transistors receiving a corresponding one of the pair of first stage output voltage signals), an active load output circuit including a pair of active load transistors (each of the pair of active load transistors electrically coupled to a corresponding one of the pair of second stage transistors), an active load impedance circuit including an active load feedback resistor electrically coupled between the pair of active load transistors, or an active load ground resistor electrically coupled to a first of the pair of active load transistors, the active load ground resistor optionally in series with an active load ground capacitor, and an active load output electrically coupled to the first of the active load transistors, and a second stage negative supply voltage network electrically coupled to the pair of second stage transistors, wherein the second stage amplifies and voltage limits the pair of first stage output voltage signals and transmits the amplified and voltage limited pair of first stage output voltage signals as an output voltage signal from the active load output, an output impedance of the second stage being a function of the active load impedance circuit.

In various embodiments of the present invention, the limiting amplifier comprises NPN and PNP BJT transistors in various circuit topologies and may optionally include an input voltage monitoring circuit. In other embodiments of the present invention, the limiting amplifier comprises enhancement mode NMOS and PMOS transistors in various circuit topologies.

In yet other embodiments of the present invention, a buffered limiting amplifier comprises (1) a first stage including a pair of first stage transistors (a first of the pair of first stage transistors receiving an input voltage signal), a first stage positive supply voltage network electrically coupled to the pair of first stage transistors, a first stage negative supply voltage network electrically coupled to the pair of first stage transistors, and an output buffer circuit including a pair of emitter-follower transistors (each of the pair of emitter-follower transistors electrically coupled to a corresponding one of the pair of first stage transistors) and a pair of first stage outputs (each of the pair of first stage outputs electrically coupled to a corresponding one of the emitter-follower transistors and transmitting a corresponding one of a pair of first stage output voltage signals) wherein the first stage amplifies the input voltage signal and transmits the amplified input voltage signal as the pair of first stage output voltage signals, and (2) a second stage including a pair of second stage transistors (each of the pair of second stage transistors receiving a corresponding one of the pair of first stage output voltage signals), an active load output circuit including a pair of active load transistors (each of the pair of active load transistors electrically coupled to a corresponding one of the pair of second stage transistors), an active load impedance circuit including of an active load feedback resistor electrically coupled between the pair of active load transistors, or an active load ground resistor electrically coupled to a first of the pair of active load transistors, the active load ground resistor optionally in series with an active load ground capacitor, and an active load output electrically coupled to the first of the active load transistors, and a second stage negative supply voltage network electrically coupled to the pair of second stage transistors, wherein the second stage amplifies and voltage limits the pair of first stage output voltage signals and transmits the amplified and voltage limited pair of first stage output voltage signals as an output voltage signal from the active load output, an output impedance of the second stage being a function of the active load impedance circuit.

In various embodiments of the present invention, the buffered limiting amplifier comprises NPN and PNP BJT transistors in various circuit topologies and may optionally include an input voltage monitoring circuit.

In still other embodiments of the present invention, a dual channel sensor circuit generates a down conversion signal, the dual channel sensor circuit comprises (1) channel A and channel B limiting amplifiers each including a first stage (each first stage receiving respective channel A or channel B input voltage signals, amplifying the respective channel A or channel B input voltage signals, and transmitting respective amplified channel A or channel B input voltage signals as respective pairs of channel A or channel B first stage output voltage signals), and a second stage for driving respective channel A or channel B sensors, each second stage including a pair of active load transistors and an active load impedance circuit including of an active load feedback resistor electrically coupled between the pair of active load transistors, or an active load ground resistor electrically coupled to a first of the pair of active load transistors, the active load ground resistor optionally in series with an active load ground capacitor, wherein each second stage receives a corresponding one of the pair of channel A or channel B first stage output voltage signals, amplifies and voltage limits the pair of channel A or channel B first stage output voltage signals, and transmits the amplified and voltage limited pair of channel A or channel B first stage output voltage signals as respective channel A or channel B output voltage signals to drive respective channel A or channel B sensors, an output impedance of the second stage being a function of the active load impedance circuit, (2) a channel A mixer including a channel A mixer buffer that receives the pair of channel A first stage output voltage signals and transmits a pair of channel A mixer buffer output voltage signals, a channel A mixer second stage that receives the pair of channel A mixer buffer output voltage signals, the channel A mixer second stage including a pair of channel A mixer second stage active load transistors, a channel A mixer second stage active load impedance circuit including a channel A mixer second stage active load feedback resistor electrically coupled between the pair of channel A mixer second stage active load transistors, or a channel A mixer second stage active load ground resistor electrically coupled to a first of the pair of channel A mixer second stage active load transistors, a channel A mixer second stage output electrically coupled to the first of the channel A mixer second stage active load transistors, a channel A mixer second stage mixing port, and an output filter electrically coupled to the channel A mixer second stage output, wherein the channel A mixer second stage amplifies and voltage limits the pair of channel A mixer buffer output voltage signals, filters the amplified and voltage limited pair of channel A mixer buffer output voltage signals via the output filter, and outputs the filtered amplified and voltage limited pair of channel A mixer buffer output voltage signals as the down conversion signal, and (3) a channel B mixer stage including a channel B mixer buffer that receives the pair of channel B first stage output voltage signals and that transmits a pair of channel B mixer buffer output voltage signals, a channel B mixer second stage that receives the pair of channel B mixer buffer output voltage signals, the channel B mixer second stage including a pair of channel B mixer second stage transistors, a channel B mixer second stage output electrically coupled to a first of the pair of channel B mixer second stage transistors, and a current mirror circuit electrically coupled to the channel B mixer second stage output and to the channel A mixer second stage mixing port, wherein the channel B mixer second stage modulates the gain of the channel A mixer second stage via the current mirror circuit.

In other embodiments of the present invention, the dual channel sensor circuit comprises NPN and PNP BJT transistors in various circuit topologies. In still other embodiments of the present invention, the dual channel sensor circuit further comprises channel A and channel B SAW resonators, each of the channel A and channel B SAW resonators includes a 2-port SAW resonator, a first port of each 2-port SAW resonator transmitting a respective one of the channel A and channel B input voltage signals, a second port of each 2-port SAW resonator receiving a respective one of the channel A and channel B output voltage signals, wherein each of the channel A and channel B SAW resonators includes a recognition layer that makes the resonators sensitive to a target agent, wherein a magnitude of a frequency of the down conversion signal indicates the presence of a target agent and/or a quantity of the target agent.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 8 illustrates the simulation results for the second simulation example in accordance with one or more embodiments of the present invention with a 10Ω loss for the 2-port SAW circuit resonator.

FIG. 9 illustrates the simulation results for the second simulation example in accordance with one or more embodiments of the present invention with a 75Ω loss for the 2-port SAW circuit resonator.

FIG. 10 illustrates the simulation results for the second simulation example in accordance with one or more embodiments of the present invention with a 100Ω loss for the 2-port SAW circuit resonator.

FIG. 11 illustrates the simulation results for the second simulation example in accordance with one or more embodiments of the present invention with a 100Ω loss for the 2-port SAW circuit resonator, where the simulation reaches steady state.

DETAILED DESCRIPTION

Figure 2:
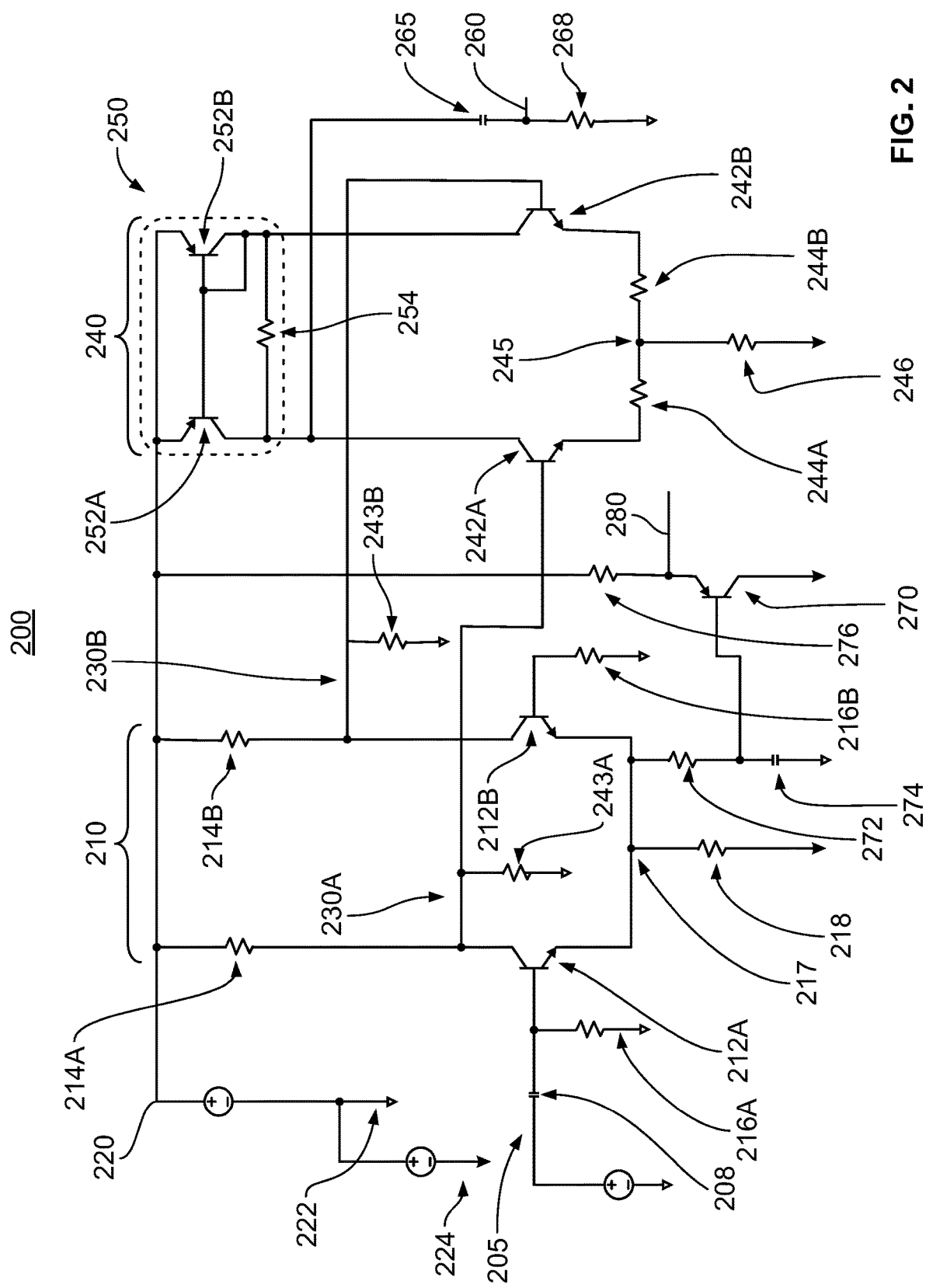
FIG. 2 illustrates a first exemplary multifunctional RF limiting amplifier in accordance with one or more embodiments of the present invention.

FIG. 2 illustrates a first exemplary multifunctional RF limiting amplifier 200 in accordance with at least one embodiment of the present invention. The limiting amplifier 200 includes a first stage 210 that provides gain, i.e., amplification, and input impedance control, along with a second stage 240 that provides gain, voltage limiting, and output impedance control. The first stage 210 receives an input voltage signal 205 via an input capacitor 208. The first stage 210 has a pair of first stage NPN bipolar junction transistors (BJTs) 212A, 212B, a first stage positive supply voltage network, and a first stage negative supply voltage network. The first stage positive supply voltage network includes a pair of first stage supply resistors 214A, 214B that connect the collectors of the first stage transistors 212A, 212B to the positive supply voltage rail 220. The input voltage signal 205 is connected to the base of the first stage transistor 212A and includes a first stage base resistor 216A to ground 222. The base of the first stage transistor 212B is likewise connected to ground 222 via a first stage base resistor 216B. The first stage base resistors 216A, 216B set the input impedance to the limiting amplifier 200. The emitters of the first stage transistors 212A, 212B are connected to the first stage negative supply voltage network, in which the emitters of the first stage transistors 212A, 212B are tied together at node 217 and connected to the negative supply voltage rail 224 via a first stage ground resistor 218.

The first stage 210 provides gain and half wave rectifies the input voltage signal 205 via the base-emitter junction of the first stage transistor 212A.

The two first stage outputs 230A, 230B, and corresponding two first stage output voltage signals from the first stage 210, are connected to the second stage 240 via the bases of a pair of second stage NPN BJT transistors 242A, 242B. The two first stage outputs 230A, 230B, and corresponding two first stage output voltage signals from the first stage 210, are also connected to ground 222 via corresponding first stage output resistors 243A, 243B. The emitters of the second stage transistors 242A, 242B are connected to the negative supply voltage rail 224 via a second stage negative supply voltage network, in which the emitters of the second stage transistors 242A, 242B are tied together at node 245 via corresponding second stage coupling resistors 244A, 244B, and from there are connected to the negative supply voltage rail 224 via a second stage ground resistor 246. The second stage negative supply voltage network thus comprises the second stage coupling resistors 244A, 244B, and the second stage ground resistor 246. The second stage transistors 242A, 242B provide additional gain and voltage limiting via their bias current, i.e., the two first stage output voltage signals 230A, 230B, and an active load feedback resistor 254 of an active load output circuit 250.

The collectors of the second stage transistors 242A, 242B are connected to the positive supply voltage rail 220 via the active load output circuit 250, which takes the form of a current mirror with feedback. The active load output circuit 250 includes a pair of active load PNP BJT transistors 252A, 252B. The collectors of the active load transistors 252A, 252B are connected to the corresponding collectors of the second stage transistors 242A, 242B, while the emitters of the active load transistors 252A, 252B are connected to the positive supply voltage rail 220. The bases of the active load transistors 252A, 252B are tied together and connected to the collector of active load transistor 252B. The collectors of the active load transistors 252A, 252B are tied together via the active load feedback resistor 254. The active load output 260, and corresponding output voltage signal, is tapped off the collector of the active load transistor 252A via an output capacitor 265, with the output load device represented by load resistor 268 connected to ground 222. The active load output circuit 250, with its active load transistors 252A, 252B and active load feedback resistor 254 improves efficiency in part by allowing the collector currents in both of the second stage transistors, 242A, 242B to contribute to the current ultimately supplied to the output load device represented by load resistor 268, and actively providing a desired output impedance via the active load feedback resistor 254 and the bias currents chosen which are proportional to the gm of the active load transistors 252A, 252B. The output impedance $Z_{OUT}$ is given by Equation 1:

$$Z_{OUT}=(1/gm_1+R_F)/2,\qquad\text{Eq. 1}$$

where $gm_1$ corresponds to the transconductance of the active load transistors 252A, 252B, while $R_F$ corresponds to the resistance of the active load feedback resistor 254. At relatively high bias currents through the emitters of the second stage transistors 242A, 242B, for example 1 mA or greater, the $R_F$ term dominates Equation 1, resulting in an output impedance $Z_{OUT} \approx R_F/2$. By using an active load feedback resistor 254 having a value of 100Ω, one can readily achieve the desired typical system impedance of 50Ω, thereby achieving maximum coupling efficiency between the limiting amplifier 200 and a 50Ω load.

The limiting amplifier 200 illustrated in FIG. 2 implements an optional input voltage signal amplitude monitoring function via a monitor PNP BJT transistor 270. The base of the monitor transistor 270 is coupled to the emitter of first stage transistor 212B between a monitor coupling resistor 272 and a monitor capacitor 274 connected to ground 222. The collector of the monitor transistor 270 is connected to the negative supply voltage rail 224, while the emitter of monitor transistor 270 is connected to the positive supply voltage rail 220 via a monitor supply resistor 276. The monitor voltage signal 280 is provided between the emitter of the monitor transistor 270 and the monitor supply resistor 276. Operationally, the signal at node 217 has been rectified by first stage transistor 212A and is subsequently low pass filtered by the combination of the monitor coupling resistor 272 and the monitor capacitor 274. This filtered signal is then buffed by the monitor transistor 270.

The limiting amplifier 200 illustrated in FIG. 2 has a symmetrical limiting design in that the voltage limiting is symmetrical with respect to ground 222, i.e., the output voltage signal at the active load output 260 is limited at $\pm V_{LIMIT}$.

Figure 1A:
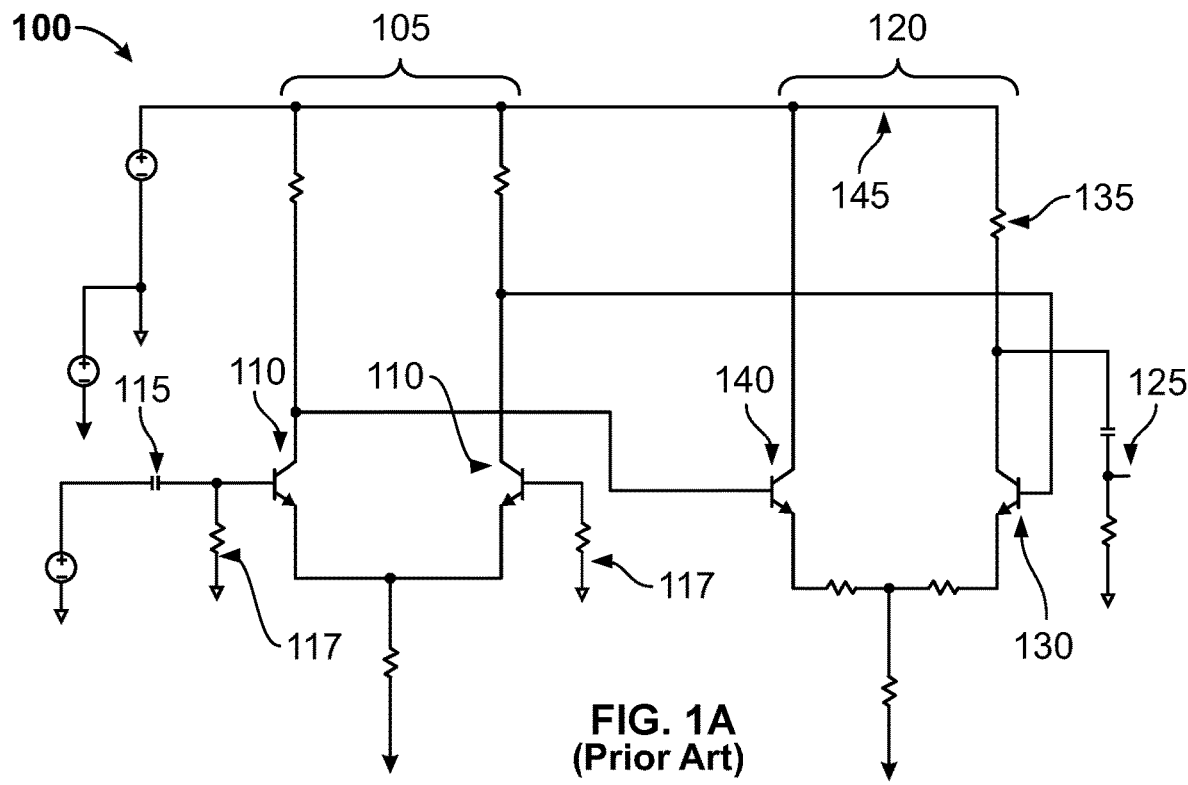
FIGS. 1A-1B illustrate two prior art two-stage differential amplifiers.
Figure 1B:
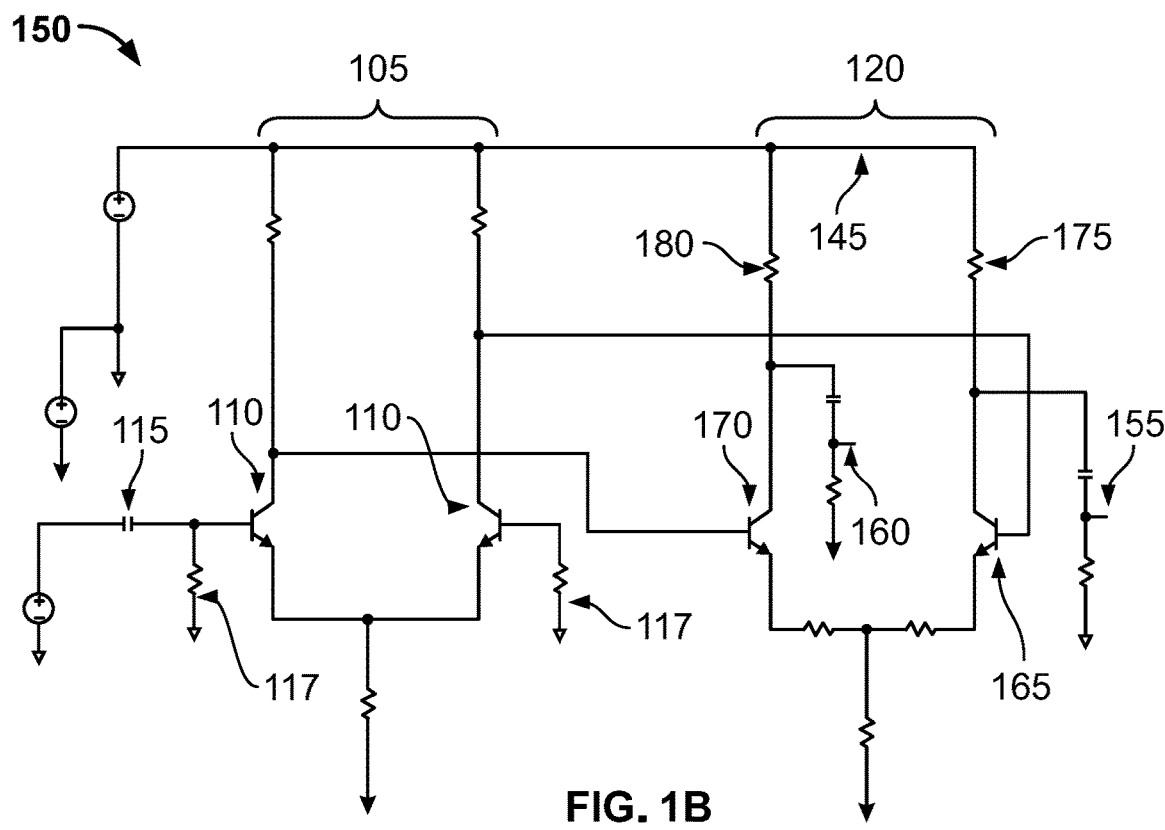

While the limiting amplifier 200 illustrated in FIG. 2 is similar to the limiting amplifier 100 illustrated in FIG. 1A in that both provide a single (not differential) output, limiting amplifier 200 is more efficient. In particular, the collector current passing through the second stage transistor 140 of the prior art limiting amplifier 100 is wasted as it is not employed at the output port 125. In contrast, the current in the collectors of both second stage transistors 242A, 242B contribute to the current provided at the active load output 260. The net result is that while both second stage transistors 130, 140 in limiting amplifier 100 must be driven at full current, both second stage transistors 242A, 242B can be driven at half that current. As the second stage transistors 242A, 242B are operating at half the current, the second stage 240 is more efficient in limiting amplifier 200 than the second stage 120 in limiting amplifier 100.

The following provides the simulation results for the limiting amplifier 200 illustrated in FIG. 2. The first simulation had the following values for the corresponding elements:

| Element | Value | Element | Value |
|---|---|---|---|
| positive supply voltage rail 220 | +3.3 V | negative supply voltage rail 224 | −3.3 V |
| capacitor 208 | 0.1 μF | second stage transistors 242 | 2N5769 |
| first stage transistors 212 | 2N5769 | resistors 244 | 5 Ω |
| resistors 214 | 100 Ω | resistor 246 | 250 Ω |
| resistors 216 | 50 Ω | active load transistors 252 | 2N5771 |
| resistor 218 | 500 Ω | resistor 254 | 100 Ω |
| amplitude monitoring transistor 270 | 2N5771 | capacitor 265 | 0.1 μF |
| resistor 272 | 10 kΩ | resistor 268 | 50 Ω |
| capacitor 274 | 0.001 μF | resistor 276 | 3 kΩ |

Figure 3:
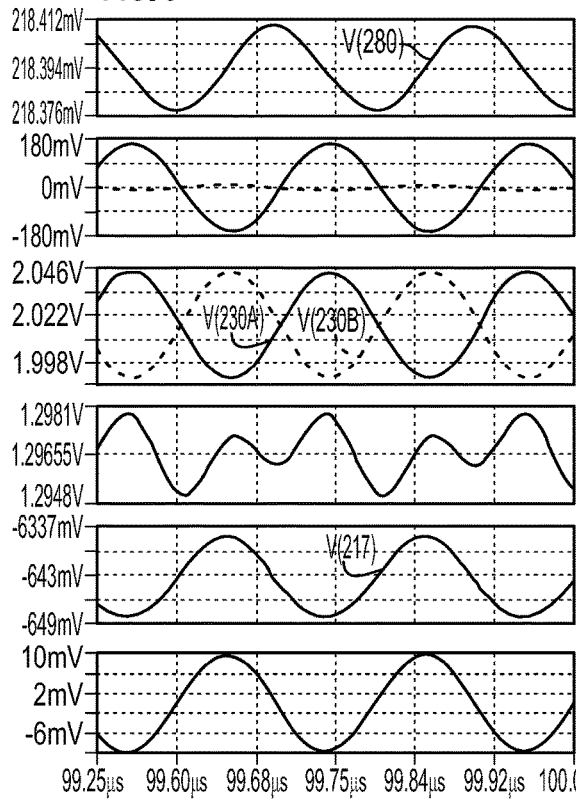
FIG. 3 illustrates the simulation results for the first exemplary multifunctional RF limiting amplifier in accordance with one or more embodiments of the present invention with an input voltage signal having an amplitude of 20 mV peak-to-peak.

FIG. 3 illustrates various signal levels when the input voltage signal 205 has an amplitude of 20 mV peak-to-peak. The voltages are identified by their element or node numbers. For example, V(280) and V(205) correspond to the monitor voltage signal 280 and the input voltage signal 205, respectively. The resultant gain of the limiting amplifier 200 is approximately 24 dB, resulting in an output voltage signal at the active load output 260 having an amplitude of approximately 360 mV peak-to-peak. As this output voltage signal at the active load output 260 amplitude is less than the limiting output voltage of 900 mV peak-to-peak, the limiting amplifier 200 is operating in its linear range. The monitor voltage signal 280 has a nominal value of approximately 232.5 mV.

Figure 4:
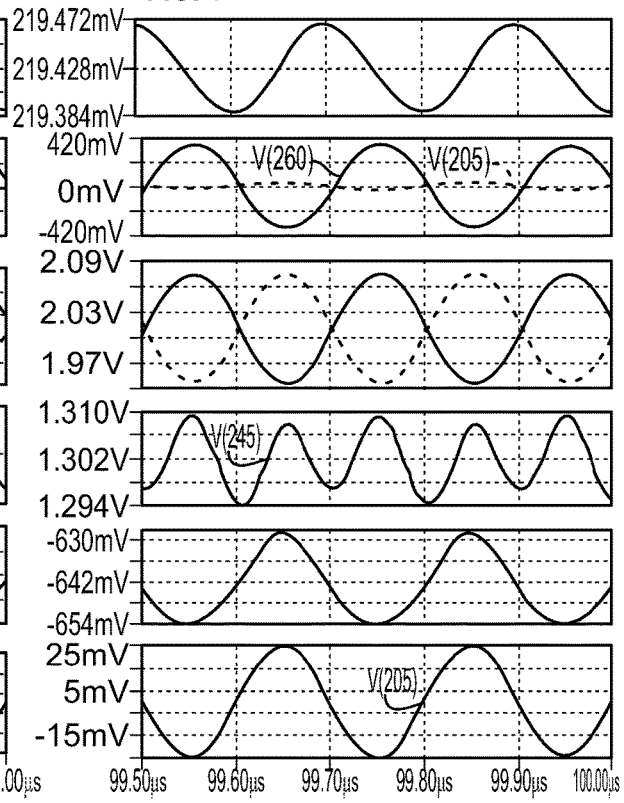
FIG. 4 illustrates the simulation results for the first exemplary multifunctional RF limiting amplifier in accordance with one or more embodiments of the present invention with an input voltage signal having an amplitude of 50 mV peak-to-peak.

FIG. 4 illustrates various signal levels when the input voltage signal 205 has an increased amplitude of 50 mV peak-to-peak. The resultant gain of the limiting amplifier 200 has dropped slightly to approximately 23 dB, resulting in an output voltage signal at the active load output 260 having an amplitude of approximately 840 mV peak-to-peak. As this output voltage signal 260 amplitude is less than, but approaching, the limiting output voltage of 900 mV peak-to-peak, the limiting amplifier 200 is still operating in its linear range. The monitor voltage signal 280 has increased to a nominal value of approximately 233.5 mV.

Figure 5:
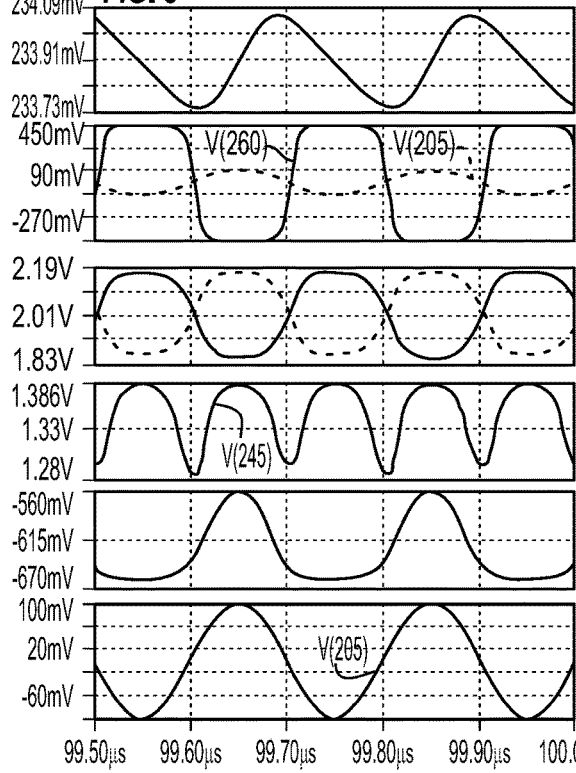
FIG. 5 illustrates the simulation results for the first exemplary multifunctional RF limiting amplifier in accordance with one or more embodiments of the present invention with an input voltage signal having an amplitude of 200 mV peak-to-peak.

FIG. 5 illustrates various signal levels when the input voltage signal 205 has a further increased amplitude of 200 mV peak-to-peak. The resultant gain of the limiting amplifier 200 has dropped to approximately 13 dB, resulting in an output voltage signal at the active load output 260 having an amplitude of approximately 900 mV peak-to-peak. As illustrated in FIG. 5, the output voltage signal 260 is being significantly squared off, i.e., the limiting amplifier 200 is now operating in its limiting range. The monitor voltage signal 280 has increased to a nominal value of approximately 248.0 mV.

Figure 6:
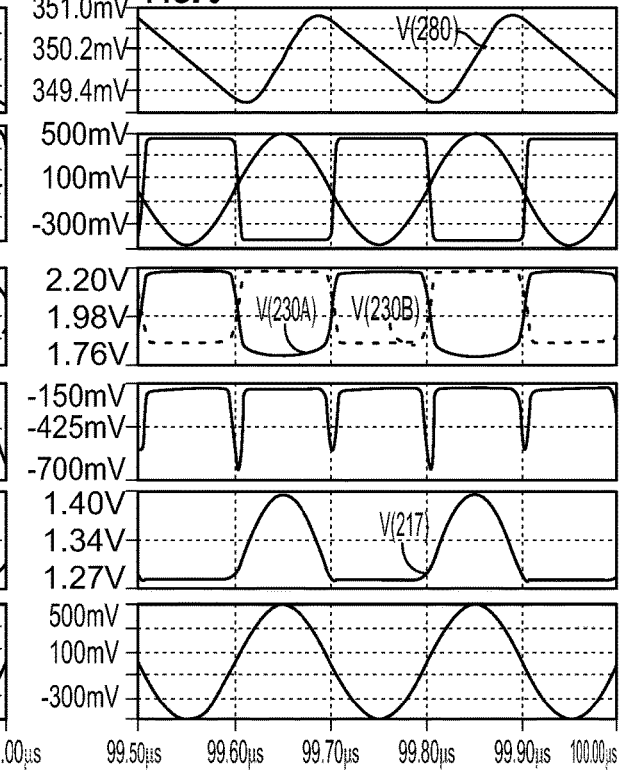
FIG. 6 illustrates the simulation results for the first exemplary multifunctional RF limiting amplifier in accordance with one or more embodiments of the present invention with an input voltage signal having an amplitude of 1.0 V peak-to-peak.

FIG. 6 illustrates various signal levels when the input voltage signal 205 has a further increased amplitude of 1.0 V peak-to-peak. The resultant gain of the limiting amplifier 200 has dropped to slightly less than approximately 0 dB, resulting in an output voltage signal at the active load output 260 having an amplitude of approximately 950 mV peak-to-peak. As illustrated in FIG. 6, the output voltage signal at the active load output 260 is even further squared off, i.e., the limiting amplifier 200 is now operating deep in its limiting range. The monitor voltage signal 280 has now increased to a nominal value of approximately 365.4 mV.

FIGS. 3-6 thus show the limiting action of the output voltage signal 260 relative to the input voltage signal 205 as the input voltage signal 205 goes from a small to a large signal amplitude. The output voltage signal 260 goes from linear amplification of the input voltage signal 205 to an approximately unity gain limiting square wave that remains phase coherent at a constant 180° of the input voltage signal 205. For this embodiment of the present invention, as the amplitude of the input voltage signal 205 increases above 200 mV peak-to-peak, the output voltage signal 260 remains at 1V peak-to-peak until a transistor breakdown voltage is exceeded. Also shown in FIGS. 3-6 is the monitor voltage signal 280, which is the ac amplitude monitor of the input voltage signal 205. The monitor voltage signal 280 increases in dc voltage as the input voltage signal 205 varies from a small to a large signal amplitude.

Because the simulated load, a surface acoustic wave (SAW) device in these simulation examples, is an ac impedance, i.e., it has no dc path, a coupling capacitor is not required in this integrable design. Thus, the input capacitor 208 and output capacitor 265 would not be part of the actual circuit for the limiting amplifier 200 and are included here solely for simulation purposes. The active load output circuit 250 has a self-biased dc output and does not require any large value coupling capacitor to realize the desired function.

While the first simulations produced output voltage limiting at 900 mV peak-to-peak, other applications may require different output voltage limiting ranges. The output voltage limiting range is primarily controlled by the second stage negative voltage supply network, and in particular by the second stage ground resistor 246. For example, by reducing the value of the second stage ground resistor to half its original value, the output voltage limiting range approximately doubles.

Figure 7:
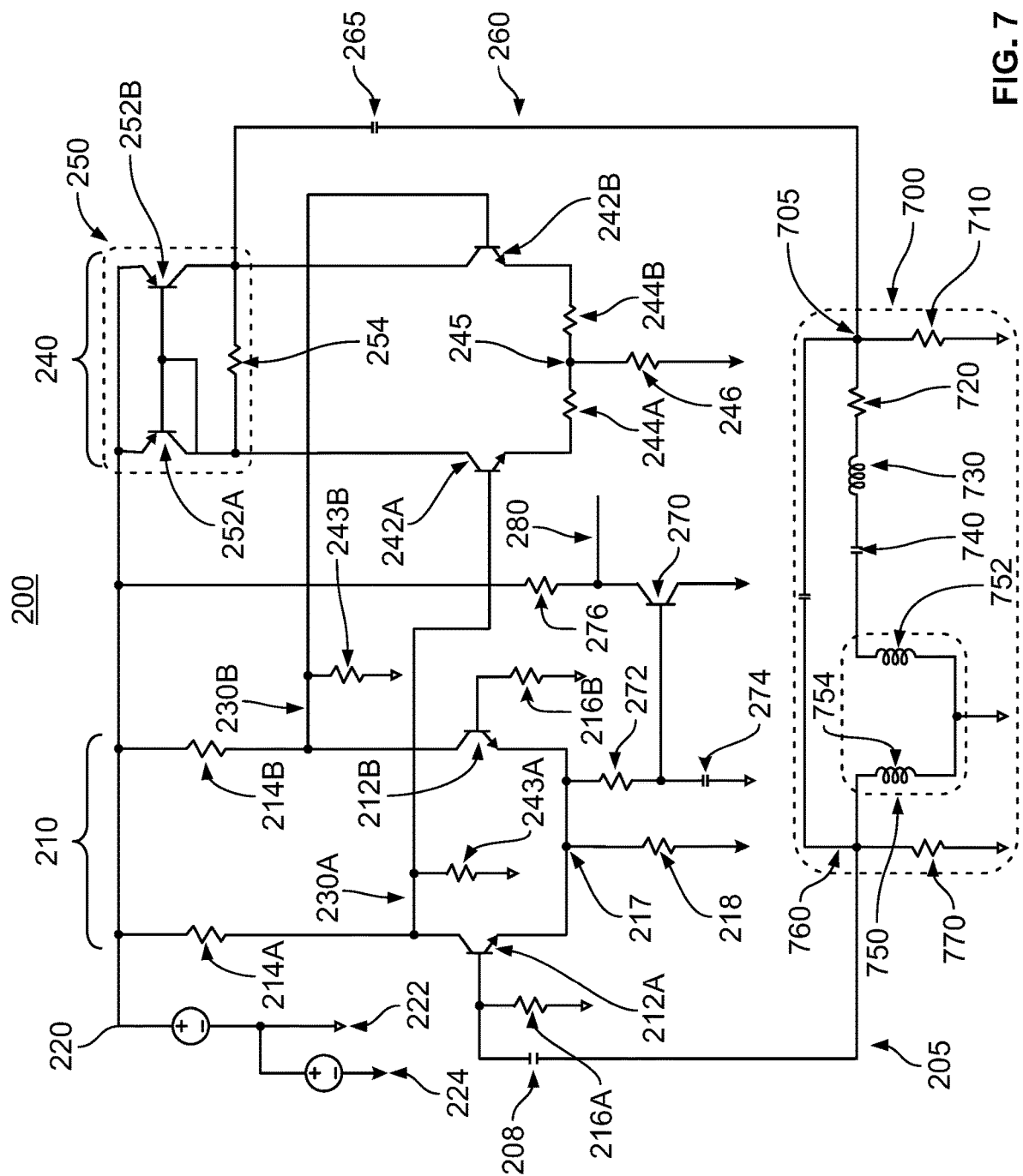
FIG. 7 illustrates a second simulation example based upon the first exemplary multifunctional RF limiting amplifier in accordance with one or more embodiments of the present invention operating as an inverting sustaining amplifier for a 2-port SAW circuit resonator.

FIG. 7 illustrates a second simulation example based upon the above first exemplary limiting amplifier 200, but with a circuit for emulating an inverting 2-port SAW circuit resonator 700 located between the input capacitor 208 and the output capacitor 265, i.e., replacing the load resistor 268. In this configuration, the limiting amplifier 200 is operating as an inverting sustaining amplifier for the 2-port SAW circuit resonator 700. The emulator circuit 700 includes a resistor 710 between its input 705 and ground 222. Between the input 705 and the transformer 750 are a resistor 720 (corresponding to the SAW resonator loss), an inductor 730, and a capacitor 740 in series. The input side of the transformer 750 is modeled as inductor 752 and is connected between the capacitor 740 and ground 222. The output side of the transformer 750 is modeled as inductor 754 with one end connected to ground 222 while the other end is connected to the output 760 of the emulator circuit 700. The output 760 of the emulator circuit 700 is connected to ground 222 via a resistor 770. Lastly, a capacitor 780 is connected between the input 705 and output 760 of the emulator circuit 700.

The following provides the results of the second simulation example. The second simulation example had the same values as the first simulation example, but had the following values for the corresponding elements of the emulator circuit 700:

| Element | Value | Element | Value |
| --- | --- | --- | --- |
| resistors 710, 770 | 50 Ω | resistor 720 | varied |
| inductor 730 | 100 μH | capacitor 740 | 10 pF |
| inductors 752, 754 | 1 μH | capacitor 780 | 2 pF |

FIG. 8 illustrates various signal levels when the resistor 720 has the value of 10Ω. The input voltage signal 205 has an amplitude of approximately 400 mV peak-to-peak, resulting in an output voltage signal at the active load output 260 having an amplitude of approximately 900 mV peak-to-peak. As can be observed, the output voltage signal at the active load output 260 has some significant overshoot, corresponding to approximately 200 mV greater than its final value. The monitor voltage signal 280 has a nominal value of approximately 272.8 mV.

FIG. 9 illustrates various signal levels when the resistor 720 has the value of 75Ω, simulating a greater loss in the SAW resonator. The input voltage signal 205 has an amplitude of approximately 160 mV peak-to-peak, resulting in an output voltage signal at the active load output 260 having an amplitude of approximately 900 mV peak-to-peak. As can be observed, the output voltage signal at the active load output 260 has less overshoot than when the SAW resonator loss, as reflected by resistor 220, had a value of 10Ω, with the overshoot corresponding to approximately 150 mV greater than its final value. The monitor voltage signal 280 has a nominal value of approximately 243.6 mV.

FIG. 10 illustrates various signal levels when the resistor 720 has the value of 100Ω, simulating an even greater loss in the SAW resonator. The input voltage signal 205 has now dropped to an amplitude of approximately 140 mV peak-to-peak, resulting in an output voltage signal at the active load output 260 still having an amplitude of approximately 900 mV peak-to-peak. As can be observed, the output voltage signal at the active load output 260 has even less overshoot than when the SAW resonator loss, as reflected by resistor 720, had values of 10Ω or 75Ω, with the overshoot corresponding to approximately 100 mV greater than its final value. The monitor voltage signal 280 now has a nominal value of approximately 240.1 mV.

FIGS. 8-10 are examples of steady state simulation waveforms resulting from a specified resonator loss, corresponding to the resistor 720, from 10Ω to 100Ω, while roughly maintaining the input impedance of the 2-port SAW circuit resonator 700 to approx. 50Ω This resonator loss, from small to progressively larger, demonstrates that the amplitude of the output voltage signal 260 due to the limiting function of the limiting amplifier 200 is approximately constant at 600 mV peak-to-peak, independent of the chosen resonator loss. The dc value of the monitor voltage signal 280 decreases with increasing resonator loss due to the amplitude of the input voltage signal 205 decreasing with this increased resonator loss.

Like FIG. 10, FIG. 11 illustrates various signal levels when the resistor 720 has the value of 100Ω but illustrates the results when the second simulation example limiting amplifier 200 and emulator circuit 700 run from start-up to steady state. As illustrated in FIG. 11, steady state is reached in approximately 25 μS, with the limiting nature of the limiting amplifier 200 clearly illustrated. One can also observe that the monitor voltage signal 280 lags, but ultimately reflects, the input voltage signal 205.

Figure 12:
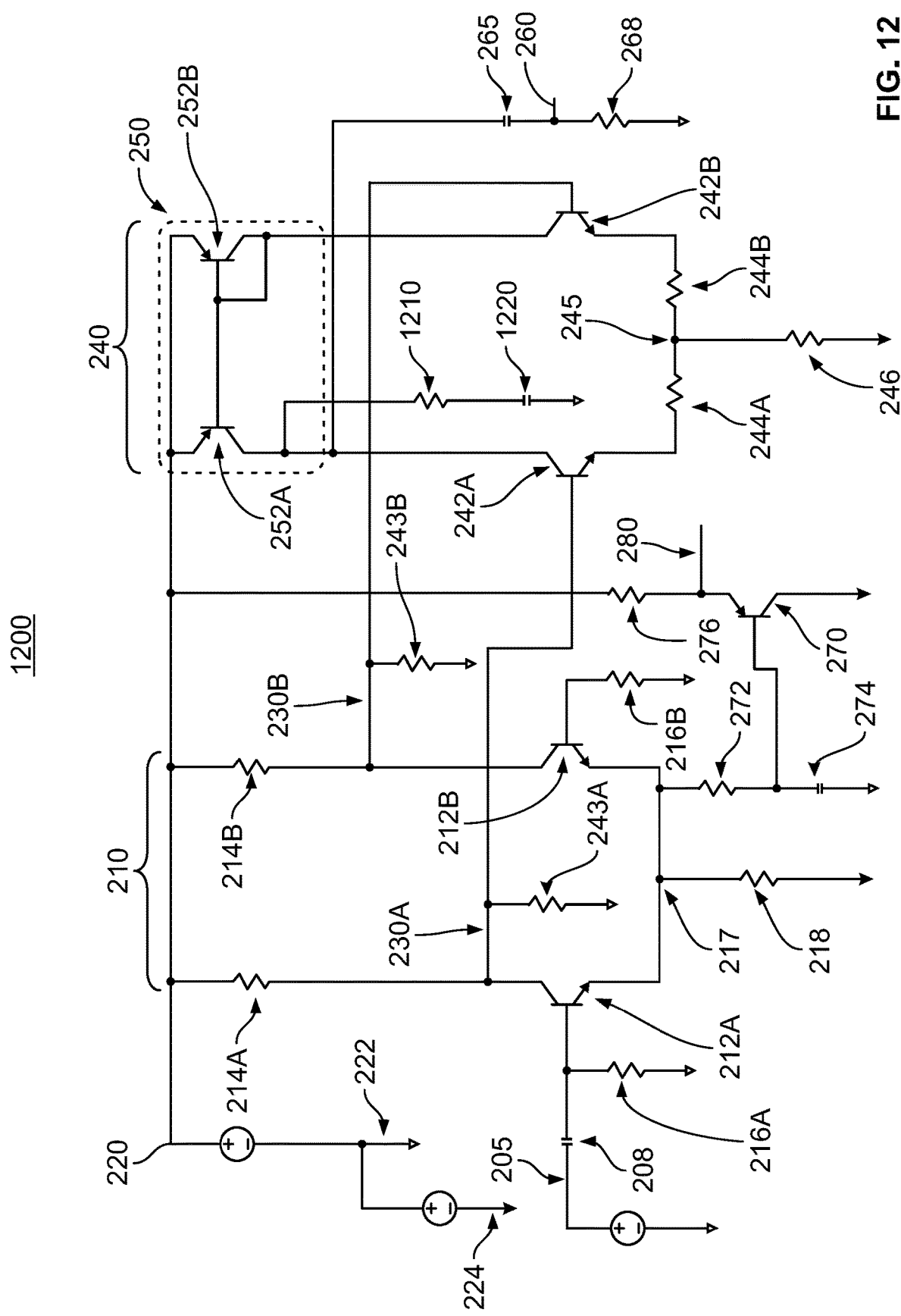
FIG. 12 illustrates a second exemplary multifunctional RF limiting amplifier in accordance with one or more embodiments of the present invention.

FIG. 12 illustrates a second exemplary multifunctional RF limiting amplifier 1200 in accordance with at least one embodiment of the present invention. The limiting amplifier 1200 is similar to the limiting amplifier 200 illustrated in FIG. 2 but implements its output impedance matching in a different manner. In particular, the multifunctional RF limiting amplifier 1200 replaces the active load feedback resistor 254 used to tie together the collectors of the active load transistors 252A, 252B with an active load ground resistor 1210 in series with an active load ground capacitor 1220 connected between the collector of the active load transistor 252A and ground 222. The active load feedback resistor 254 in the limiting amplifier 1200 and the active load ground resistor 1210 in series with the active load ground capacitor 1220 are two different types of active load impedance circuits. The multifunctional RF limiting amplifier 1200 retains many of the benefits of the multifunctional RF limiting amplifier 200 but requires an additional capacitor (active load ground capacitor 1220). When the targeted output impedance of the multifunctional RF limiting amplifier 1200 is 50Ω, then active load ground resistor 1210 should likewise have a value of be 50Ω. The multifunctional RF limiting amplifier 1200 will work with resistive output load devices. If the output load device is a capacitive/resistive circuit, then the active load ground capacitor 1220 is not required. For example, this embodiment of the present invention, which requires a large value active load ground capacitor 1220 to provide the desired output impedance, is less desirable when the load is a SAW device. As described above, the SAW device, while having an AC impedance, has no DC impedance, and thus no active load ground capacitor 1220 is required in the design. This is especially true as the active load ground capacitor 1220 is not an integrable device, and therefore not a desired requirement.

Figure 13:
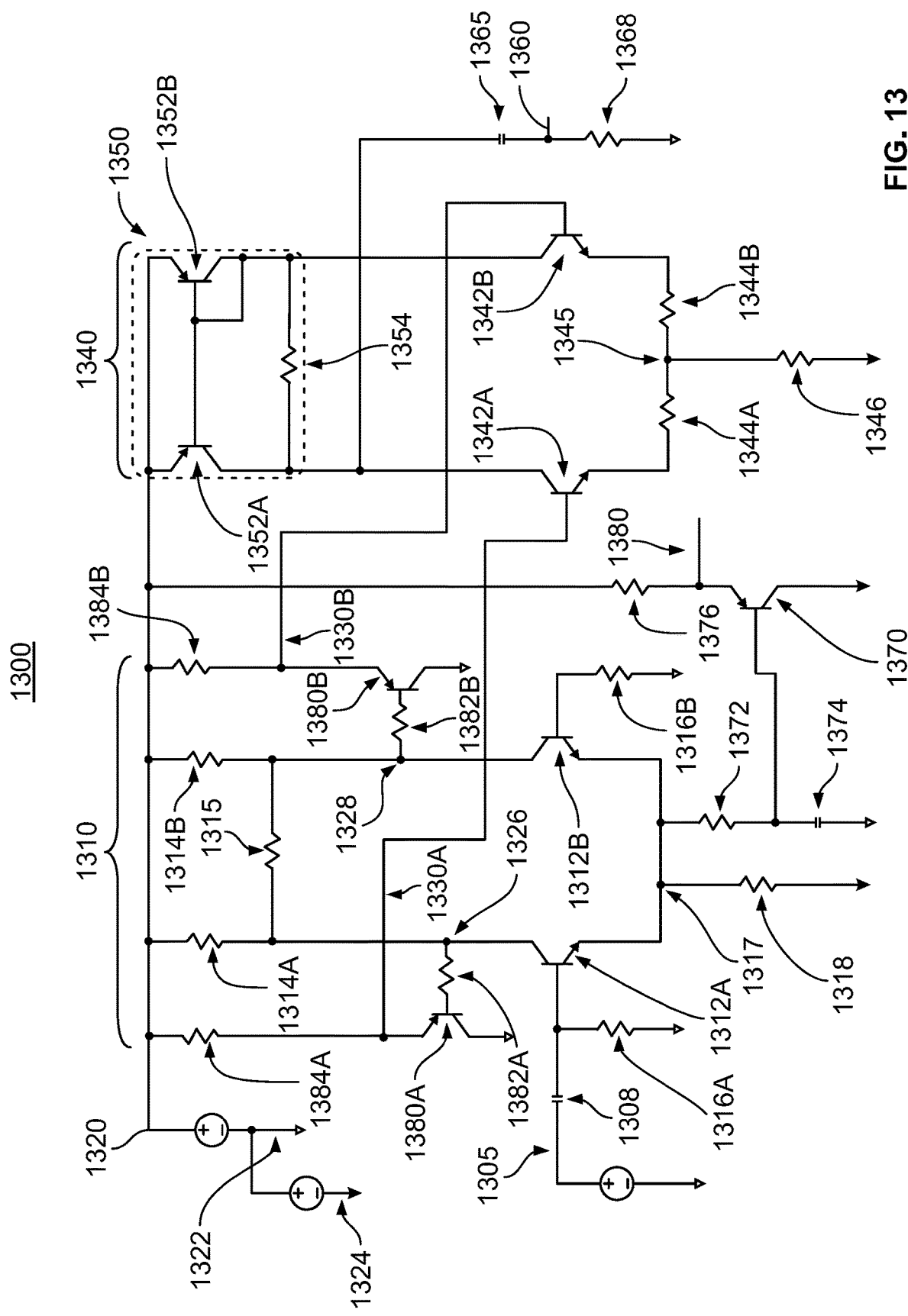
FIG. 13 illustrates a third exemplary multifunctional RF limiting amplifier in accordance with one or more embodiments of the present invention.

FIG. 13 illustrates a third exemplary multifunctional RF limiting amplifier 1300 in accordance with at least one embodiment of the present invention. The limiting amplifier 1300 is similar to the limiting amplifier 200 illustrated in FIG. 2 but includes an improved first stage positive supply voltage network for the first stage 1310 and a corresponding pair of emitter-followers to more efficiently drive the second stage 1340. The first stage 1310 receives an input voltage signal 1305 via an input capacitor 1308. The first stage 1310 has a pair of first stage NPN BJT transistors 1312A, 1312B, and is connected to the positive voltage 1320 by the first stage positive supply voltage network. The positive supply voltage network in this embodiment of the present invention includes a pair of first stage supply resistors 1314A, 1314B that connect the collectors of the first stage transistors 1312A, 1312B to the positive supply voltage rail 1320, and a first stage shared resistor 1315 that connects the collectors of the first stage transistors 1312A, 1312B to each other. This first stage positive supply voltage network, which includes the combination of the resistors 1314A, 1314B, 1315, forms a more efficient first stage positive supply voltage network for the first stage 1310 compared to the first stage positive supply voltage network, which includes resistors 214A, 214B, in the limiting amplifier 200 illustrated in FIG. 2. Specifically, the first stage positive supply voltage network improves the current efficiency by allowing a wide range of adjustable AC gain and DC amplitude at the nodes 1326, 1328 over a wide range of bias currents. The input voltage signal 1305 is connected to the base of the first stage transistor 1312A and includes a first stage base resistor 1316A to ground 1322. The base of the first stage transistor 1312B is likewise connected to ground 1322 via a first stage base resistor 1316B. The emitters of the first stage transistors 1312A, 1312B are connected to the first stage negative supply voltage network, in which the emitters of the first stage transistors 1312A, 1312B are tied together at node 1317 and connected to the negative supply voltage rail 1324 via a first stage ground resistor 1318.

The first stage 1310 of the limiting amplifier 1300 further includes an output buffer circuit having a pair of emitter-follower PNP BJT transistors 1380A, 1380B, which serve a buffering function. The bases of the emitter-follower transistors 1380A, 1380B are connected to the collectors of the first stage transistors 1312A, 1312B via corresponding output buffer circuit base resistors 1382A, 1382B at corresponding nodes 1326, 1328, respectively. The collectors of the emitter-follower transistors 1380A, 1380B are connected to ground 1322, while the emitters of the emitter-follower transistors 1380A, 1380B are connected to the positive supply voltage rail 1320 via corresponding output buffer circuit supply resistors 1384A, 1384B.

The two first stage outputs 1330A, 1330B, and corresponding two first stage output voltage signals from the first stage 1310, are connected to the second stage 1340 via the bases of a pair of second stage NPN BJT transistors 1342A, 1342B. The emitters of the second stage transistors 1342A, 1342B are connected to the negative supply voltage rail 1324 via a second stage negative supply voltage network, in which the emitters of the second stage transistors 1342A, 1342B are tied together at node 1345 via corresponding second stage coupling resistors 1344A, 1344B, and from there are connected to the negative supply voltage rail 1324 via a second stage ground resistor 1346. The second stage negative supply voltage network thus comprises the second stage coupling resistors 1344A, 1344B, and the second stage ground resistor 1346.

The collectors of the second stage transistors 1342A, 1342B are connected to the positive supply voltage rail 1320 via an active load output circuit 1350. The active load output circuit 1350 includes a pair of active load PNP BJT transistors 1352A, 1352B. The collectors of the active load transistors 1352A, 1352B are connected to the corresponding collectors of the second stage transistors 1342A, 1342B, while the emitters of the active load transistors 1352A, 1352B are connected to the positive supply voltage rail 1320. The bases of the active load transistors 1352A, 1352B are tied together and connected to the collector of active load transistor 1352B. The collectors of the active load transistors 1352A, 1352B are tied together via the active load feedback resistor 1354. The active load output 1360, and corresponding output voltage signal, is tapped off the collector of the active load transistor 1352A via an output capacitor 1365, with the output load device corresponding to load resistor 1368 connected to ground 1322.

While the limiting amplifier 1300 illustrated in FIG. 13 includes an active load feedback resistor 1354, in other embodiments of the present invention, the active load feedback resistor 1354 is replaced by an active load ground resistor in series with an active load ground capacitor as employed by the limiting amplifier 1200 illustrated in FIG. 12.

The limiting amplifier 1300 illustrated in FIG. 13 implements an optional input voltage signal amplitude monitoring function via a monitor PNP BJT transistor 1370. The base of the monitor transistor 1370 is coupled to the emitter of first stage transistor 1312B between a monitor coupling resistor 1372 and a monitor capacitor 1374 connected to ground 1322. The collector of the monitor transistor 1370 is connected to the negative supply voltage rail 1324, while the emitter of monitor transistor 1370 is connected to the positive supply voltage rail 1320 via a monitor supply resistor 1376. The monitor voltage signal 1380 is provided between the emitter of the monitor transistor 1370 and the monitor supply resistor 1376.

The following provides the results of a third simulation example based on the design of the limiting amplifier 1300 illustrated in FIG. 13. The third simulation example had the following values for the corresponding elements:

| Element | Value | Element | Value |
|---|---|---|---|
| positive supply voltage rail 1320 | +3.3 V | negative supply voltage rail 1324 | −3.3 V |
| capacitor 1308 | 0.1 µF | second stage transistors 1342 | 2N6789 |
| first stage transistors 1312 | 2N6789 | resistors 1344 | 6 Ω |
| resistors 1314 | 1300 Ω | resistor 1346 | (modeled as a 6 mA current source) |
| resistor 1315 | 276 Ω | active load transistors 1352 | 2N6771 |
| resistor 1318 | (modeled as a 4 mA current source) | resistor 1354 | 100 Ω |
| monitor transistor 1370 | 2N6771 | output capacitor 1365 | 0.1 µF |
| resistor 1372 | 10 kΩ | resistor 1368 | 60 Ω |
| capacitor 1374 | 0.001 µF | resistor 1376 | 30 kΩ |
| emitter-follower transistors 1380 | 2N6771 | resistors 1382 | 60 Ω |
| resistors 1384 | 2.0 kΩ | | |

Figure 14:
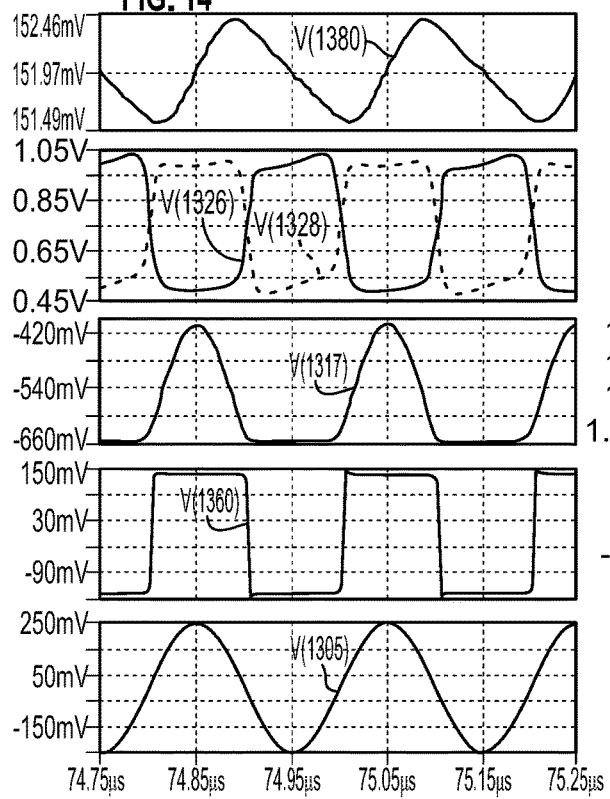
FIG. 14 illustrates the simulation results for the third exemplary multifunctional RF limiting amplifier in accordance with one or more embodiments of the present invention with an input voltage signal having an amplitude of 500 mV peak-to-peak.

FIG. 14 illustrates various signal levels for the third exemplary limiting amplifier 1300 when the input voltage signal 1305 has an amplitude of 500 mV peak-to-peak, while the output voltage signal at the active load output 1360 has an amplitude of 300 mV peak-to-peak. The voltages are identified by their element or node numbers. For example, V(1380) and V(1305) correspond to the monitor voltage signal 1380 and the input voltage signal 1305, respectively. As illustrated in FIG. 14, the output voltage signal at the active load output 1360 is squared off, i.e., the limiting amplifier 1300 is operating deep in its limiting range. The monitor voltage signal 1380 has a nominal value of approximately 152.0 mV.

At least one additional benefit of the limiting amplifier 1300 illustrated in FIG. 13 with its emitter-follower transistors 1380A, 1380B compared to the limiting amplifier 200 illustrated in FIG. 2 is that the emitter-follower transistors 1380A, 1380B can drive additional functional blocks. For example, the two first stage output voltage signals, via the two first stage outputs 1330A, 1330B, may be provided to one or more additional second stage(s) similar to the original second stage 1340. The original second stage 1340 may be used, for example, as an inverting sustaining amplifier to drive a SAW oscillator device, while one of the additional second stage(s) may be used for monitoring purposes without affecting the amplifier's use of driving the SAW oscillator device.

Figure 15:
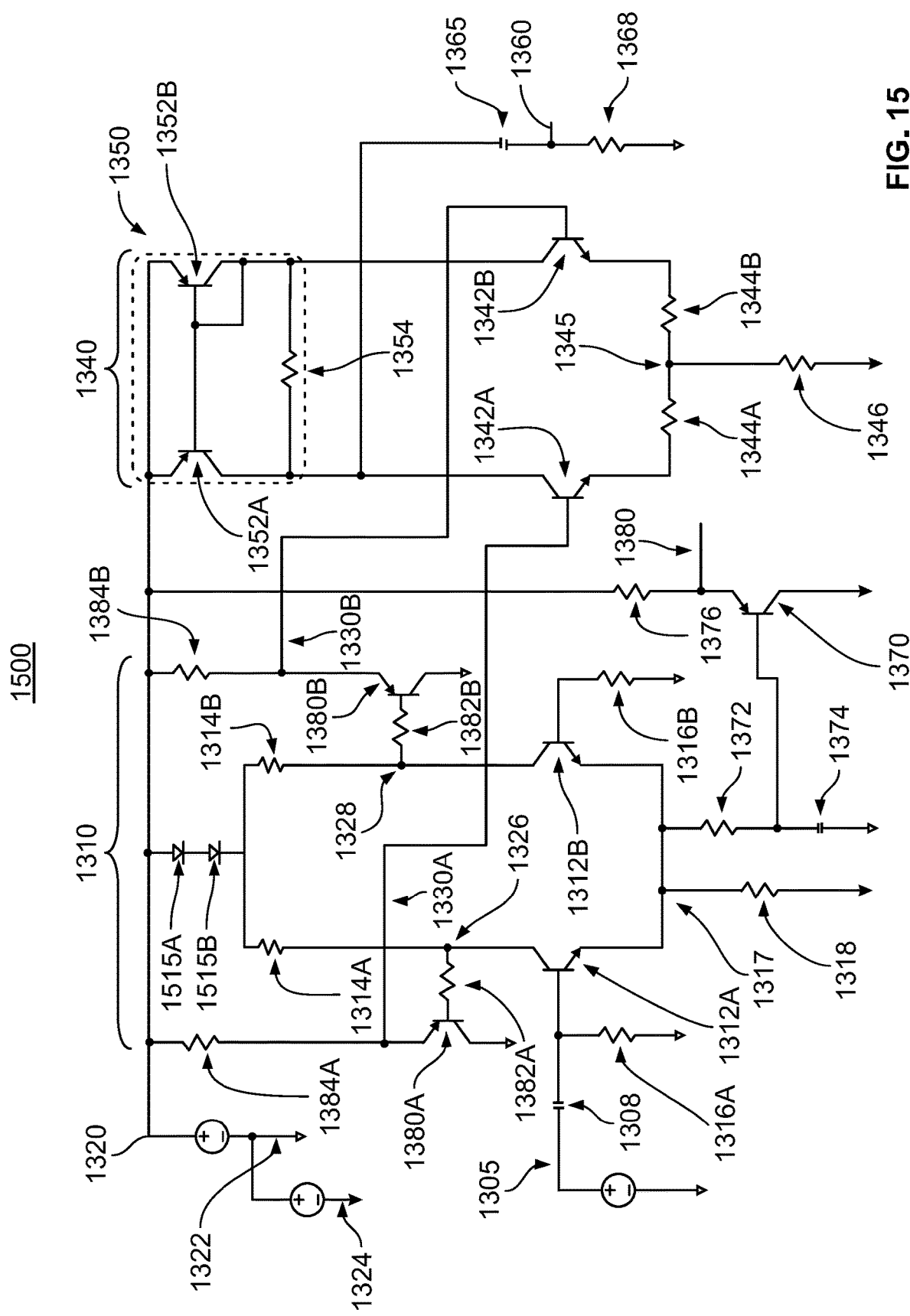
FIG. 15 illustrates a fourth exemplary multifunctional RF limiting amplifier in accordance with one or more embodiments of the present invention.

The fourth exemplary limiting amplifier 1500 illustrated in FIG. 15 is a slight variation on the limiting amplifier 1300 illustrated in FIG. 13, in which the first stage positive supply voltage network, comprising the resistors 1314A, 1314B, 1315, is revised. In particular, the resistor 1315 is removed, while the resistors 1314A, 1314B are connected to each other and from there to the positive supply voltage rail 1320 via a pair of diodes 1515A, 1515B in series. The pair of diodes 1515A, 1515B for this revised first stage positive supply voltage network offers the benefit of providing a low impedance voltage drop, which allows bias headroom for the second stage 1340.

Figure 16:
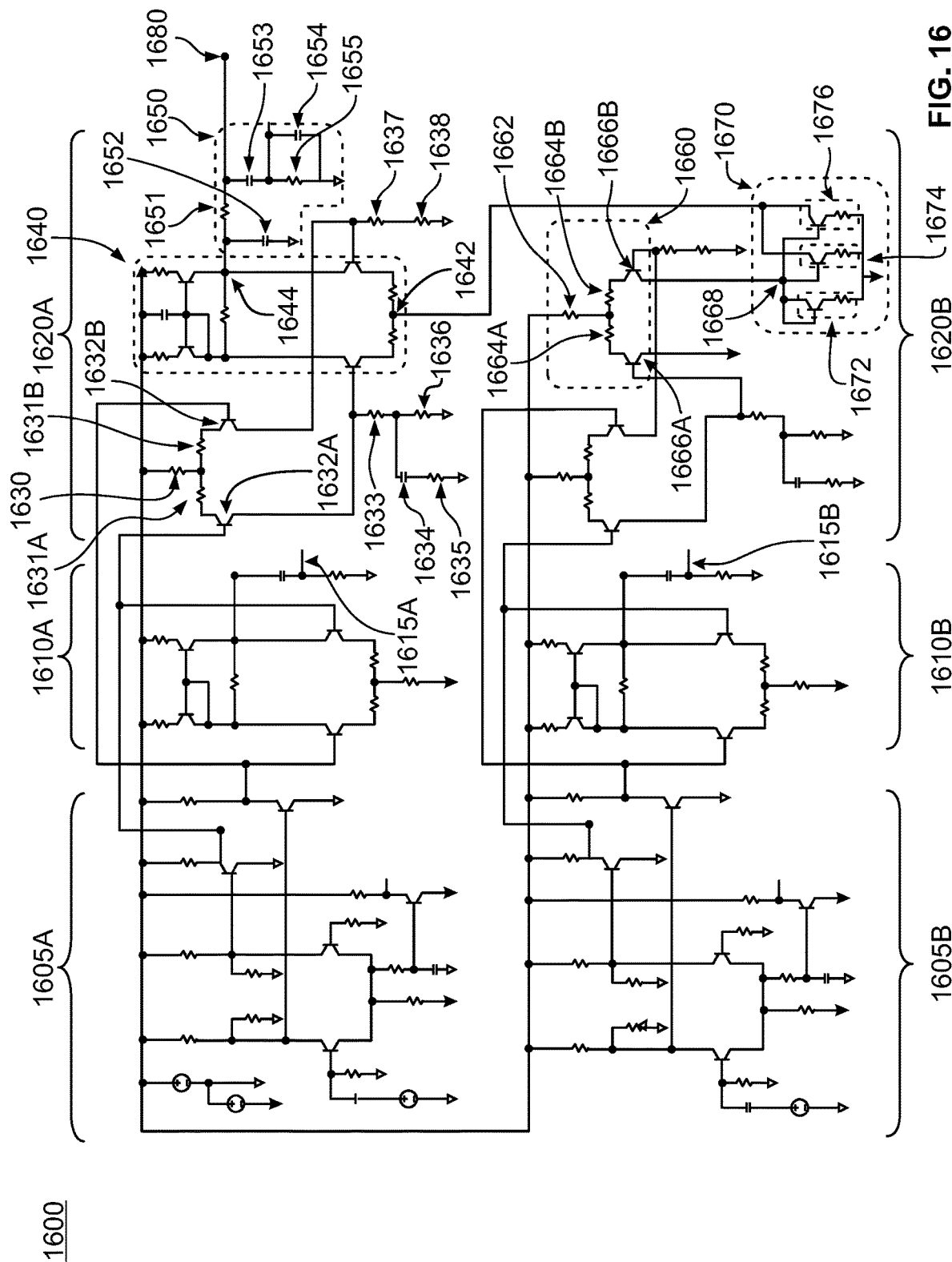
FIG. 16 illustrates a pair of limiting amplifiers with their outputs mixed to implement a down conversion function for a fifth exemplary multifunctional RF limiting amplifier in accordance with one or more embodiments of the present invention.

In at least one embodiment of the invention, a pair of the limiting amplifiers 1300 illustrated in FIG. 13 are used in a fifth exemplary two-channel limiting amplifier 1600 with their outputs mixed to implement a down conversion function as illustrated in FIG. 16. As illustrated in FIG. 16, each of the first stages 1605A, 1605B drives a corresponding second stage 1610A, 1610B, with, for example, the outputs 1615A, 1615B of the second stages 1610A, 1610B driving two corresponding SAW resonators (not illustrated). Each of the first stages 1605A, 1605B also drives a corresponding mixer 1620A, 1620B, with the mixers 1620A, 1620B coupled together to implement the down conversion function.

The first stages 1605A, 1605B of the two-channel limiting amplifier 1600 may take the form of the first stages in any of the preceding embodiments, for example, the first stage 210 of the limiting amplifier 200 illustrated in FIG. 2, the first stage 1310 of the limiting amplifier 1300 illustrated in FIG. 13, or the first stage 1310 of the limiting amplifier 1500 illustrated in FIG. 15.

The second stages 1610A, 1610B of the two-channel limiting amplifier 1600 may take the form of the second stages in any of the preceding embodiments, for example, the second stage 240 of the limiting amplifier 200 illustrated in FIG. 2, the second stage 240 of the limiting amplifier 1200 illustrated in FIG. 12, or the second stage 1340 of the limiting amplifier 1300 illustrated in FIG. 13.

To implement the down conversion in frequency between channel A and channel B, an overall mixer circuit is illustrated in FIG. 16, comprising a channel A mixer 1620A and a channel B mixer 1620B. The channel A mixer 1620A includes a channel A mixer buffer, a channel A mixer second stage 1640, and an output filter 1650. The channel B mixer 1620B includes a channel B mixer buffer, a channel B mixer second stage 1660, and a current mirror circuit 1670.

The channel A and channel B mixer buffers have the same circuit topology, and thus will be described only with respect to channel A. The channel A mixer buffer includes a mixer buffer positive supply voltage network. The following describes an exemplary mixer buffer positive supply voltage network configuration having three resistors, 1630, 1631A, 1631B, though other circuit topologies may be employed. In the illustrated embodiment of the present invention, the mixer buffer positive supply voltage network includes a supply resistor 1630 connected to the positive supply voltage rail and to a pair of mixer buffer bias resistors 1631A, 1631B. The mixer buffer bias resistors 1631A, 1631B are connected to the corresponding emitters of a pair of mixer buffer PNP BJT transistors 1632A, 1632B. The bases of the mixer buffer transistors 1632A, 1632B are connected to the two first stage outputs and corresponding two first stage output voltage signals from the first stage 1605A. The collectors of the mixer buffer transistors 1632A, 1632B provide two corresponding mixer buffer output voltage signals. The channel A mixer buffer includes a mixer buffer ground supply voltage network. The following describes an exemplary mixer buffer ground supply voltage network configuration having five resistors, 1633, 1635, 1636, 1637, 1638, and a capacitor 1634, though other circuit topologies may be employed. In the illustrated embodiment of the present invention, the mixer buffer ground supply voltage network includes the collector of mixer buffer transistor 1632A being connected to a first mixer buffer ground resistor 1633, and from there to ground via a mixer buffer ground capacitor 1634 in series with a second mixer buffer ground resistor 1635, the mixer buffer ground capacitor 1634 in series with the second mixer buffer ground resistor 1635 being in parallel with a third mixer buffer ground resistor 1636. The collector of the other mixer buffer transistor 1632B is connected to a fourth mixer buffer ground resistor 1637 in series with a fifth mixer buffer ground resistor 1638.

The channel A mixer second stage 1640 may take the form of the second stages in any of the preceding embodiments, for example, the second stage 240 of the limiting amplifier 200 illustrated in FIG. 2, the second stage 240 of the limiting amplifier 1200 illustrated in FIG. 12, or the second stage 1340 of the limiting amplifier 1300 illustrated in FIG. 13, with two differences. First, the inputs to the channel A mixer second stage 1640 are the two mixer buffer output voltage signals, not the two first stage output voltage signals from the first stage 1605A. Second, the channel A mixer second stage 1640 is connected to the mixing circuit 1670 rather than ground at the channel A mixer second stage mixing port 1642. The channel A mixer second stage output signal corresponds to the signal at the channel A mixer second stage output 1644.

The output filter 1650 is connected to the output signal of the channel A mixer second stage 1640 at the channel A mixer second stage output 1644. The output filter 1650 outputs the down conversion signal at output filter node 1680. The following describes an exemplary output filter 1650 configuration having two resistors, 1651, 1655, and three capacitors 1652, 1653, 1654, though other circuit topologies may be employed. In the illustrated embodiment of the present invention, the output filter 1650 includes the output signal of the channel A mixer second stage 1640 at the channel A mixer second stage output 1644 passing through a first output filter resistor 1651 with a first output filter capacitor 1652 to ground. The remainder of the output filter is connected to the output filter node 1680 and includes a second output filter capacitor 1653 in series with the parallel combination of a third output filter capacitor 1654 and a second output filter resistor 1655, with the parallel combination connected to ground.

The channel B mixer second stage 1660 includes a mixer second stage positive supply voltage network. The following describes an exemplary mixer second stage positive supply voltage network configuration having three resistors, 1662, 1664A, 1664B, though other circuit topologies may be employed. In the illustrated embodiment of the present invention, the mixer second stage positive supply voltage network includes a channel B mixer second stage supply resistor 1662 connected to the positive supply voltage rail and to a pair of channel B mixer second stage secondary supply resistors 1664A, 1664B. The channel B mixer second stage secondary supply resistors 1664A, 1664B are connected to the emitters of the channel B mixer second stage PNP BJT transistors 1666A, 1666B, with the channel B mixer second stage PNP BJT transistors 1666A, 1666B forming a differential amplifier transistor pair. The bases of the channel B mixer second stage transistors 1666A, 1666B are connected to the two mixer buffer output signals from the channel B mixer buffer, i.e., the corresponding collectors of the channel B mixer buffer transistors. The channel B mixer second stage output signal corresponds to the signal at the channel B mixer second stage output 1668, i.e., the collector of the channel B mixer second stage transistor 1666B.

The current mirror circuit 1670 is connected between the channel B mixer second stage 1660, specifically the channel B mixer second stage output 1668, i.e., the collector of the channel B mixer second stage transistor 1666B, and the negative supply voltage rail. The exemplary current mirror circuit 1670 illustrated in FIG. 16 includes a reference-side (or diode connected-side) circuit 1672 and a pair of output-side (or non-diode connected-side) circuits 1674, 1676 in parallel. The base of each transistor in the reference-side circuit 1672 and the pair of output-side circuits 1674, 1676 are connected to the channel B mixer second stage output 1668, i.e., the collector of the channel B mixer second stage transistor 1666B, such that the channel B mixer second stage 1660 drives the current mirror circuit 1670. The collector of the transistor in the reference-side circuit 1672 is likewise connected to the channel B mixer second stage output 1668. The emitters of each of the transistors in the reference-side circuit 1672 and the pair of output-side circuits 1674, 1676 are connected to corresponding resistors that are connected to the negative supply voltage rail. The collectors of the transistors in the pair of output-side circuits 1674, 1676 are connected to the channel A mixer second stage 1640 at the channel A mixer second stage mixing port 1642. The pair of output-side circuits 1674, 1676 may be replaced with a single output-side circuit including a single transistor in series with a single resistor, though this configuration would have less mixing efficiency.

The overall mixer circuit is a two-quadrant design where the gain of the channel A mixer second stage 1640 is modulated via the bias currents, i.e., the emitter currents in the channel A mixer second stage 1640, supplied from the current mirror circuit 1670, specifically, the pair of output-side circuits 1674, 1676, connected to the channel A mixer second stage mixing port 1642. The channel B mixer second stage 1660 drives the current mirror circuit 1670, including the pair of output-side circuits 1674, 1676. The output current at the channel A mixer second stage output 1644 has the mixed signals of channel A and B (sum and difference frequencies) which are low pass filtered by the output filter 1650 to obtain a low frequency, for example, less than 10

MHz, output signal at the output filter node 1680, which corresponds to the difference frequency of channel A and channel B. Channel A is the reference channel and provides a corresponding reference frequency, while channel B is the sensor channel used to monitor an environment and provides a corresponding sensing frequency, as discussed in greater detail below. Channel B may also include a switched array of SAW sensors allowing for more than one sensor channel of detection.

The two-channel limiting amplifier 1600 may be used in a number of dual-sensor applications. In these applications, both the channel A and channel B sensors are located on the same substrate. The channel A sensor is used as a control, while the channel B sensor is exposed to a measurand, for example, a target agent. The channel A sensor may be used to cancel any effects on the sensors due, for example, to temperature drifts or changes in humidity. The output of the dual-sensor device is based upon the difference in the resonant frequencies of the channel A and channel B sensors.

As an exemplary specific dual-sensor application, the goal may be to detect a specific biological or chemical agent. In this case, the channel B sensor is exposed to an environment which may contain the biological or chemical agent. In a preferred embodiment, the channel A and channel B sensors are SAW resonator devices, which are both treated with a "recognition layer," thereby making the SAW resonator devices sensitive to a specific biological or chemical agent. An exemplary recognition layer is a molecular imprinted polymer that adsorbs the specific biological or chemical agent. When the specific biological or chemical agent is present, the resonant frequency of the channel B SAW resonator changes, with greater concentrations of the specific biological or chemical agent leading to greater changes in the resonant frequency of the channel B SAW resonator. The two SAW resonator devices are driven by the outputs of the first second stages 1620A, 1620B of the two-channel limiting amplifier 1600.

While the recognition layer in some embodiments of the present invention is a molecular imprinted polymer for detecting a biological or chemical agent, other embodiments of the present invention may use other types of recognition layers for detecting biological or chemical agents. These other types of recognition layers include, for example, supramolecular host-guest structures, metal oxide layers, carbon nanotubes and composites, functional polymeric coatings, and biological recognition materials. See A. Mujahid and F. L. Dickert, "Surface Acoustic Wave (SAW) for Chemical Sensing Applications of Recognition Layers," Sensors 2017, vol. 17, no. 12, art. no. 2716 (2017), the contents of which are incorporated herein by reference.

One detects whether the specific biological or chemical agent is present by comparing the resonant frequency of the channel B SAW resonator with the resonant frequency of the reference channel A SAW resonator. This comparison of the two resonant frequencies is undertaken by the two mixers 1620A, 1620B of the two-channel limiting amplifier 1600. The frequency of the mixer output voltage signal at the output filter node 1680 may be used in at least two different ways. In a first case, the frequency of the mixer output voltage signal is compared to a detection reference frequency. If the frequency of the mixer output voltage signal is greater/less than the detection reference frequency, the specific biological or chemical agent is determined to be present/not present. In a second case, the magnitude of the frequency of the mixer output voltage signal provides a quantitative indication of the amount of the specific biological or chemical agent that is present. In this example, the higher the frequency of the mixer output voltage signal the greater the amount of the specific biological or chemical agent present.

Figure 17:
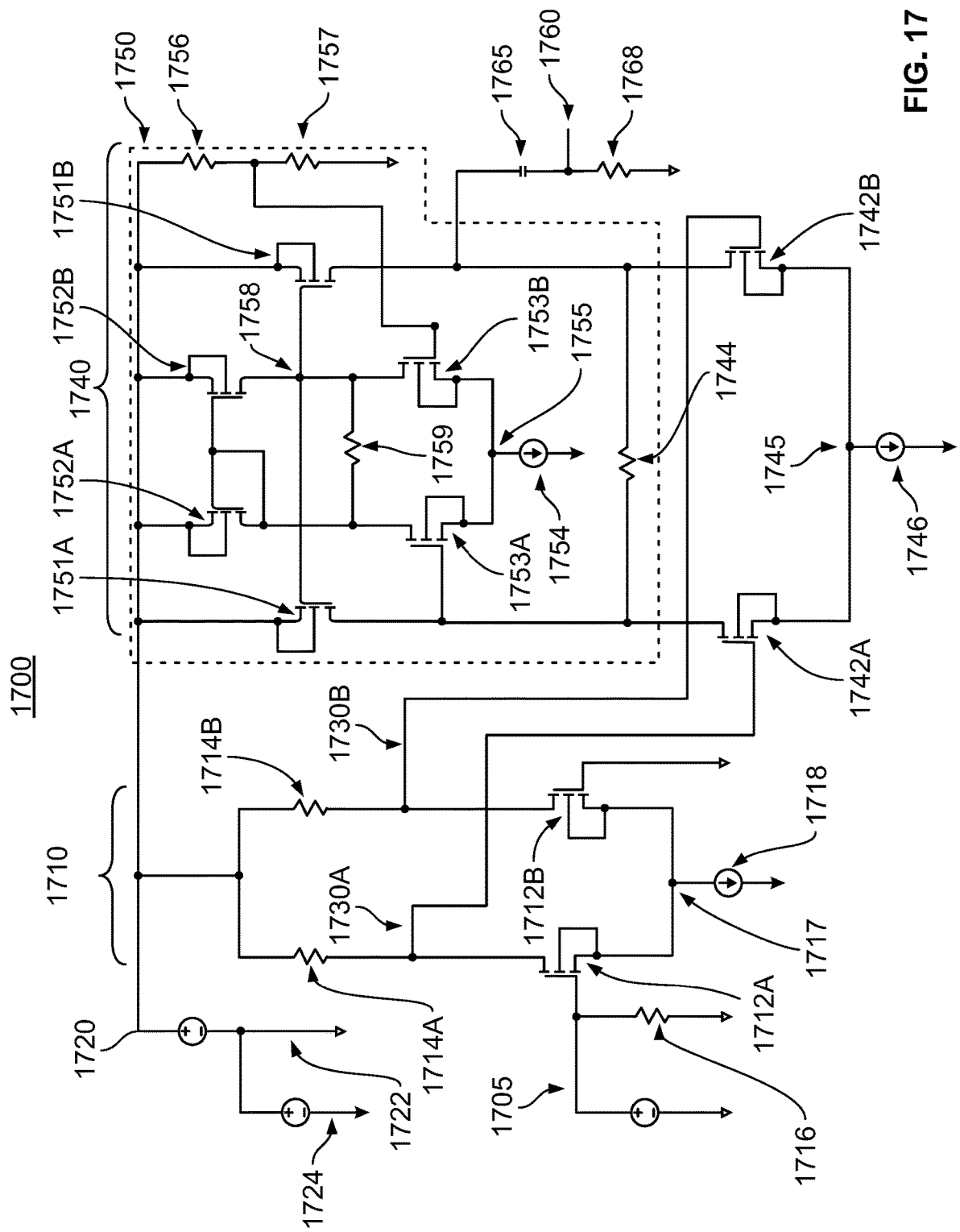
FIG. 17 illustrates a sixth exemplary multifunctional RF limiting amplifier in accordance with one or more embodiments of the present invention.

While the various limiting amplifiers described above and illustrated in FIGS. 2, 12, 13, 15, and 16 employ BJT transistors, other embodiments of the present invention employ CMOS transistors, such as the sixth exemplary limiting amplifier 1700 illustrated in FIG. 17.

This CMOS-based limiting amplifier 1700 provides the same functionality of the previous BJT-based limiting amplifiers: independently adjustable gain, input and output impedances, and output voltage limiting. Given the same bias current, a MOS transistor will have approximately five to ten time less transconductance (gm) as a bipolar transistor. Therefore, the active load in the output of the second stage can be difficult to realize in CMOS given a desired low output impedance, for example, 50Ω. To achieve 20+ dB of gain and a 50Ω output impedance, the active load requires an embedded third amplifier, in the form of an active current mirror, to effectively increase the active load gm, as described below.

The limiting amplifier 1700 includes a first stage 1710 that provides gain, i.e., amplification, and input impedance control, along with a second stage 1740 that provides gain, voltage limiting, and output impedance control. The first stage 1710 has a pair of NMOS enhancement mode first stage transistors 1712A, 1712B with an input voltage signal 1705 applied to the gate of the first of the first stage transistors 1712A, a first stage positive supply voltage network, and a first stage negative supply voltage network. The first stage positive supply voltage network includes a pair of first stage supply resistors 1714A, 1714B that connect the drains of the first stage transistors 1712A, 1712B to the positive supply voltage rail 1720. The gate of the first stage transistor 1712A is connected to the ground 1722 via a first stage gate resistor 1716. The gate of the first stage transistor 1712B is directly connected to ground 1722. The sources of the first stage transistors 1712A, 1712B are connected to the first stage negative supply voltage network, in which the sources of the first stage transistors 1712A, 1712B are tied together at node 1717 and connected to the negative supply voltage rail 1724 via a first stage current source 1718.

The two first stage outputs 1730A, 1730B, and corresponding two first stage output voltage signals from the first stage 1710, are connected to the second stage 1740 via the gates of a pair of NMOS enhancement type second stage transistors 1742A, 1742B. The sources of the second stage transistors 1742A, 1742B are connected to the negative supply voltage rail via a second stage negative supply voltage network, in which the sources of the second stage transistors 1742A, 1742B are tied together at a node 1745, and from there are connected to the negative supply voltage rail 1724 via a second stage current source 1746. The second stage transistors 1742A, 1742B provide additional gain and voltage limiting controlled by the second stage current source 1746.

The drains of the second stage transistors 1742A, 1742B are connected to the positive supply voltage rail 1720 via the active load output circuit 1750. The active load output circuit includes an active load feedback resistor 1744 between the drains of the second stage transistors 1742A, 1742B. The active load output circuit 1750 includes a pair of PMOS enhancement mode active load transistors 1751A, 1751B. The drains of the pair of active load transistors 1751A, 1751B are connected to the corresponding drains of the second stage transistors 1742A, 1742B, while the sources of the pair of active load transistors 1751A, 1751B are connected to the positive supply voltage rail 1720.

The active current mirror noted above comprises a pair of active current mirror PMOS enhancement mode transistors 1752A, 1752B, a pair of active current mirror NMOS enhancement mode transistors 1753A, 1753B, an active current mirror resistor 1759, an active current mirror current source 1754, and first and second active current mirror bias resistors 1756, 1757. The elements of the active current mirror are configured as follows. The sources of the active current mirror PMOS transistors 1752A, 1752B are connected to the positive supply voltage rail 1720, while their drains are connected to the corresponding drains of the pair of active current mirror NMOS transistors 1753A, 1753B. The sources of the pair of active current mirror NMOS transistors 1753A, 1753B are tied together at a node 1755 and from there are connected to the negative supply voltage rail 1724 via an active current mirror current source 1754. The drain of one of the active current mirror PMOS transistors 1752A is tied to the gates of both of the active current mirror PMOS transistors 1752A, 1752B. The drains of the active current mirror PMOS transistors 1752A, 1752B are connected to each other via the active current mirror resistor 1759. The gates of the pair of active load transistors 1751A, 1751B are both tied to the drain of one of the active current mirror PMOS transistors 1752B. The gate of one of the pair of active current mirror NMOS transistors 1753A is connected to the drain of one of the pair of active load transistors 1751A. The active current mirror further includes a first active current mirror bias resistor 1756 connected to the positive supply voltage rail 1720 and to a second active current mirror bias resistor 1757, with the second active current mirror bias resistor 1757 connected to ground 1722. The voltage at the node between the first active current mirror bias resistor 1756 and the second active current mirror bias resistor 1757 is applied to the gate of one of the pair of active current mirror NMOS transistors 1753B. This active current mirror configuration allows the active load feedback resistor 1744 to dominate the value of the output impedance by effectively increasing the transconductance of the pair of active load transistors 1751A, 1751B via the voltage gain of this active current mirror. The overall gain of the active current mirror is controlled by the active current mirror current source 1754.

The active load output 1760, and corresponding output voltage signal, is tapped off the drain of one of the pair of active load transistors 1751B via an output capacitor 1765, with the output load device represented by a load resistor 1768 connected to ground 1722.

The following provides the results of a fourth simulation example based on the design of the limiting amplifier 1700 illustrated in FIG. 17. The fourth simulation example had the following values for the corresponding elements:

| Element | Value | Element | Value |
|---|---|---|---|
| positive supply voltage rail 1720 | + 5.0 V | negative supply voltage rail 1724 | −5.0 V |
| resistors 1714 | 2 kΩ | resistor 1756 | 30 kΩ |
| resistor 1716 | 60 Ω | resistor 1757 | 10 kΩ |
| first stage current source 1718 | 4 mA | resistor 1759 | 100 kΩ |
| resistor 1744 | 100 Ω | output capacitor 1765 | 1 μF |
| second stage current source 1746 | 6 mA | resistor 1768 | 50 Ω |
| active current mirror current source 1754 | 2 mA | | |

Figure 18:
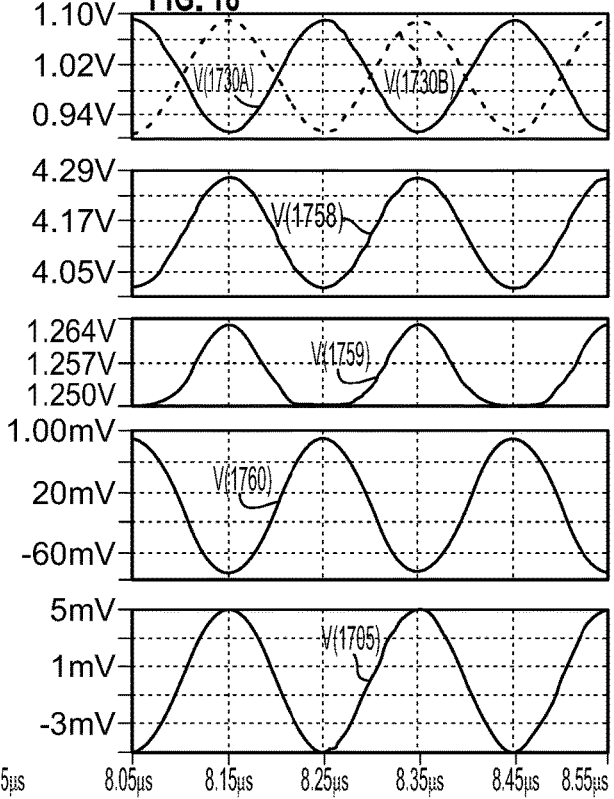
FIG. 18 illustrates the simulation results for the sixth exemplary multifunctional RF limiting amplifier in accordance with one or more embodiments of the present invention with an input voltage signal having an amplitude of 10 mV peak-to-peak.

FIG. 18 illustrates various signal levels for the sixth exemplary limiting amplifier 1700 when the input voltage signal 1705 has an amplitude of 10 mV peak-to-peak, while the output voltage signal at the active load output 1760 has an amplitude of 180 mV peak-to-peak. The resultant gain of the limiting amplifier 1700 is approximately 25 dB. The voltages are identified by their element or node numbers. For example, V(1758) and V(1705) correspond to the node 1758 voltage signal and the input voltage signal 1705, respectively. As this output voltage signal at the active load output 1760 amplitude is less than the limiting output voltage of 300 mV peak-to-peak, the limiting amplifier 1700 is operating in its linear range.

Figure 19:
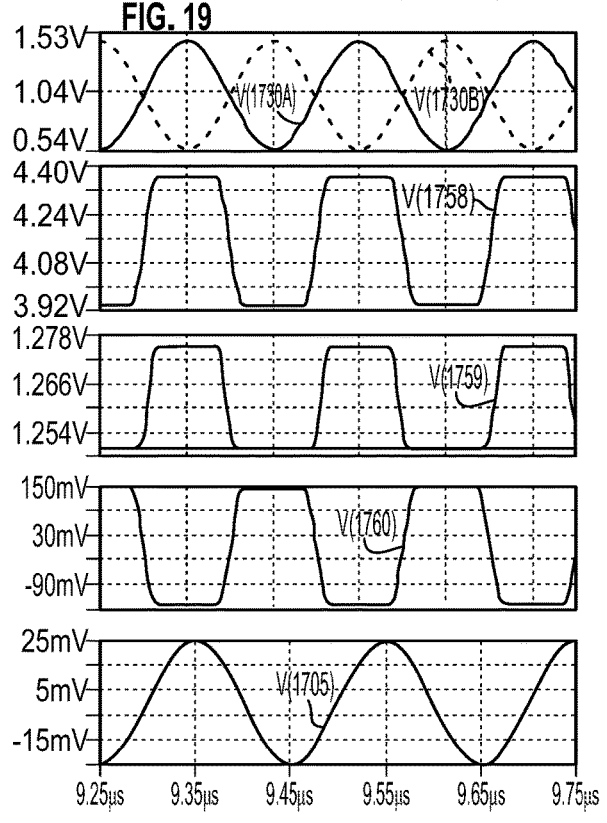
FIG. 19 illustrates the simulation results for the sixth exemplary multifunctional RF limiting amplifier in accordance with one or more embodiments of the present invention with an input voltage signal having an amplitude of 50 mV peak-to-peak.

FIG. 19 illustrates various signal levels when the input voltage signal 1705 has an increased amplitude of 50 mV peak-to-peak. The resultant gain of the limiting amplifier 1700 has dropped to approximately 15 dB, resulting in an output voltage signal at the active load output 1760 having an amplitude of approximately 300 mV peak-to-peak. As illustrated in FIG. 19, the output voltage signal 1760 is being significantly squared off, i.e., the limiting amplifier 1700 is now operating in its limiting range.

Figure 20:
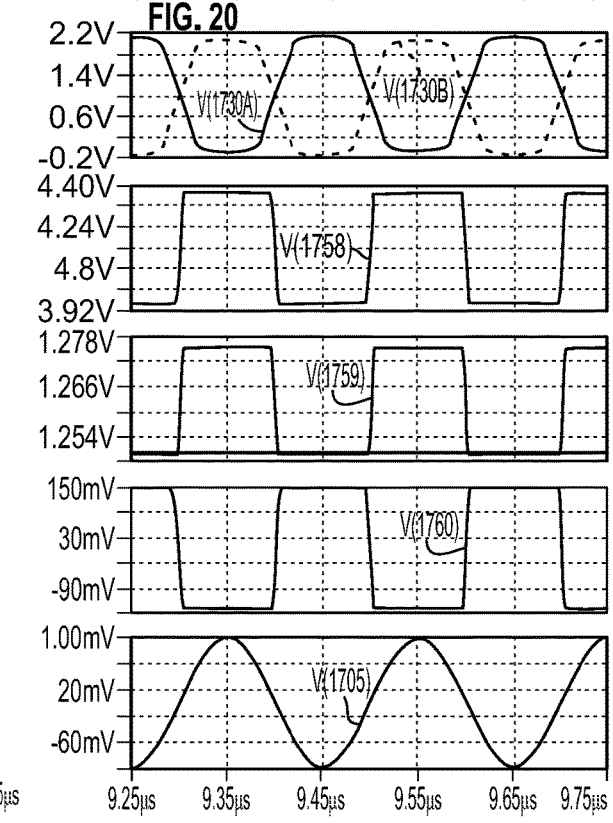
FIG. 20 illustrates the simulation results for the sixth exemplary multifunctional RF limiting amplifier in accordance with one or more embodiments of the present invention with an input voltage signal having an amplitude of 200 mV peak-to-peak.

FIG. 20 illustrates various signal levels when the input voltage signal 1705 has a further increased amplitude of 200 mV peak-to-peak. The resultant gain of the limiting amplifier 1700 has dropped to approximately −4 dB, resulting in an output voltage signal at the active load output 1760 having an amplitude of approximately 300 mV peak-to-peak. As illustrated in FIG. 20, the output voltage signal at the active load output 1760 is even further squared off, i.e., the limiting amplifier 1700 is now operating deep in its limiting range.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A limiting amplifier comprising:
   a first stage, the first stage including:
      a pair of first stage transistors, a first of the pair of first stage transistors adapted to receive an input voltage signal;
      a first stage positive supply voltage network electrically coupled to the pair of first stage transistors; and
      a first stage negative supply voltage network electrically coupled to the pair of first stage transistors;
      wherein the first stage is adapted to amplify the received input voltage signal and to transmit the amplified input voltage signal as a pair of first stage output voltage signals; and
   a second stage, the second stage including:
      a pair of second stage transistors, each of the pair of second stage transistors adapted to receive a corresponding one of the pair of first stage output voltage signals;

an active load output circuit, the active load output circuit including:
- a pair of active load transistors, each of the pair of active load transistors electrically coupled to a corresponding one of the pair of second stage transistors;
- an active load impedance circuit, the active load impedance circuit including an active load feedback resistor electrically coupled between the pair of active load transistors, or an active load ground resistor electrically coupled to a first of the pair of active load transistors, the active load ground resistor optionally in series with an active load ground capacitor; and
- an active load output electrically coupled to the first of the active load transistors; and a second stage negative supply voltage network electrically coupled to the pair of second stage transistors;
wherein the second stage is adapted to amplify and voltage limit the pair of first stage output voltage signals and to transmit the amplified and voltage limited pair of first stage output voltage signals as an output voltage signal from the active load output; and
wherein an output impedance of the second stage is a function of the active load impedance circuit.

2. The limiting amplifier of claim 1,
wherein each of the pair of first stage transistors comprises a corresponding NPN BJT transistor, a base of the first of the pair of first stage transistors adapted to receive the input voltage signal;
wherein the first stage positive supply voltage network includes a pair of first stage supply resistors, a first terminal of each of the pair of first stage supply resistors electrically coupled to a collector of a corresponding one of the pair of first stage transistors;
wherein the first stage negative supply voltage network includes a first stage ground resistor, a first terminal of the first stage ground resistor electrically coupled to an emitter of each of the pair of first stage transistors;
wherein a first of the pair of first stage output voltage signals corresponds to a voltage at the collector of the first of the pair of first stage transistors; and
wherein a second of the pair of first stage output voltage signals corresponds to a voltage at the collector of the second of the pair of first stage transistors.

3. The limiting amplifier of claim 1,
wherein each of the pair of first stage transistors comprises a corresponding enhancement mode NMOS transistor, a gate of the first of the pair of first stage transistors adapted to receive the input voltage signal;
wherein the first stage positive supply voltage network includes a pair of first stage supply resistors, a first terminal of each of the pair of first stage supply resistors electrically coupled to a drain of a corresponding one of the pair of first stage transistors;
wherein the first stage negative supply voltage network includes a first stage current source, a first terminal of the first stage current source electrically coupled to a source of each of the pair of first stage transistors;
wherein a first of the pair of first stage output voltage signals corresponds to a voltage at the drain of the first of the pair of first stage transistors; and
wherein a second of the pair of first stage output voltage signals corresponds to a voltage at the drain of the second of the pair of first stage transistors.

4. The limiting amplifier of claim 1,
wherein the second stage negative supply voltage network includes:
- a pair of second stage coupling resistors, a first terminal of each of the pair of second stage coupling resistors electrically coupled together at a second stage node; and
- a second stage ground resistor, a first terminal of the second stage ground resistor electrically coupled to the second stage node;

wherein each of the pair of second stage transistors comprises a corresponding NPN BJT transistor;
wherein a base of each of the pair of second stage transistors is adapted to receive a corresponding one of the pair of first stage output voltage signals; and
wherein an emitter of each of the pair of second stage transistors is electrically coupled to a second terminal of a corresponding one of the pair of second stage coupling resistors.

5. The limiting amplifier of claim 1,
wherein each of the pair of second stage transistors comprises a corresponding enhancement mode NMOS transistor;
wherein the second stage negative supply voltage network includes a second stage current source, a first terminal of the second stage current source being electrically coupled to a source of each of the pair of second stage transistors; and
wherein a gate of each of the pair of second stage transistors is adapted to receive a corresponding one of the pair of first stage output voltage signals.

6. The limiting amplifier of claim 1,
wherein each of the pair of active load transistors comprises a corresponding PNP BJT transistor;
wherein a base of the first of the pair of active load transistors is electrically coupled to a base of a second of the pair of active load transistors;
wherein a collector of each of the pair of active load transistors is electrically coupled to a corresponding one of the pair of second stage transistors;
wherein the base of the second of the pair of active load transistors is electrically connected to the collector of the second of the pair of active load transistors;
wherein if the active load impedance circuit includes the active load feedback resistor, a first terminal of the active load feedback resistor is electrically coupled to the collector of the first of the pair of active load transistors and a second terminal of the active load feedback resistor is electrically coupled to the collector of the second of the pair of active load transistors;
wherein if the active load impedance circuit includes the active load ground resistor optionally in series with the active load ground capacitor, a first terminal of the active load ground resistor is electrically coupled to the collector of the first of the pair of active load transistors; and
wherein the active load output is electrically connected to the collector of the first of the pair of active load transistors.

7. The limiting amplifier of claim 1,
wherein each of the pair of active load transistors comprises a corresponding PMOS enhancement mode active load transistor,
wherein the active load output circuit further includes an active current mirror, the active current mirror including:

a pair of PMOS enhancement mode active current mirror transistors;
a pair of NMOS enhancement mode active current mirror transistors;
an active current mirror resistor;
a first active current mirror bias resistor;
a second active current mirror bias resistor; and
an active current mirror current source;
wherein the active load feedback resistor is electrically coupled between drains of the pair of active load transistors;
wherein gates of the pair of active load transistors are each electrically coupled to a drain of a first of the pair of PMOS enhancement mode active current mirror transistors;
wherein gates of the pair of PMOS enhancement mode active current mirror transistors are electrically coupled to one another and to a drain of a second of the pair of PMOS enhancement mode active current mirror transistors;
wherein the active current mirror resistor is electrically coupled between drains of the pair of PMOS enhancement mode active current mirror transistors;
wherein a first terminal of the active current mirror current source is electrically coupled to a source of each of the pair of NMOS enhancement mode active current mirror transistors;
wherein a first terminal of the first active current mirror bias resistor and a first terminal of the second active current mirror bias resistor are electrically coupled to a gate of a first of the pair of NMOS enhancement mode active current mirror transistors;
wherein a gate of a second of the pair of NMOS enhancement mode active current mirror transistors is electrically coupled to the drain of a first of the pair of active load transistors; and
wherein the active load output is electrically connected to the drain of a second of the pair of active load transistors.

8. The limiting amplifier of claim 1 further comprising:
a monitor transistor comprising a PNP BJT transistor;
a monitor supply resistor, a first terminal of the first monitor resistor electrically coupled to an emitter of the monitor transistor;
a monitor coupling resistor, a first terminal of the monitor coupling resistor electrically coupled to a second of the pair of first stage transistors and a second terminal of the monitor coupling resistor electrically coupled to a base of the monitor transistor; and
a monitor capacitor, a first terminal of the monitor capacitor electrically coupled to the base of the monitor transistor;
wherein a monitor voltage signal corresponds to a voltage at the emitter of the monitor transistor, the monitor voltage signal indicative of an amplitude of the input voltage signal.

9. A buffered limiting amplifier comprising:
a first stage, the first stage including:
a pair of first stage transistors, a first of the pair of first stage transistors adapted to receive an input voltage signal;
a first stage positive supply voltage network electrically coupled to the pair of first stage transistors;
a first stage negative supply voltage network electrically coupled to the pair of first stage transistors; and
an output buffer circuit, the output buffer circuit including:
a pair of emitter-follower transistors, each of the pair of emitter-follower transistors electrically coupled to a corresponding one of the pair of first stage transistors; and
a pair of first stage outputs, each of the pair of first stage outputs electrically coupled to a corresponding one of the emitter-follower transistors, each of the pair of first stage outputs adapted to transmit a corresponding one of a pair of first stage output voltage signals;
wherein the first stage is adapted to amplify the input voltage signal and to transmit the amplified input voltage signal as the pair of first stage output voltage signals; and
a second stage, the second stage including:
a pair of second stage transistors, each of the pair of second stage transistors adapted to receive a corresponding one of the pair of first stage output voltage signals;
an active load output circuit, the active load output circuit including:
a pair of active load transistors, each of the pair of active load transistors electrically coupled to a corresponding one of the pair of second stage transistors;
an active load impedance circuit, the active load impedance circuit including of an active load feedback resistor electrically coupled between the pair of active load transistors, or an active load ground resistor electrically coupled to a first of the pair of active load transistors, the active load ground resistor optionally in series with an active load ground capacitor; and
an active load output electrically coupled to the first of the active load transistors; and
a second stage negative supply voltage network electrically coupled to the pair of second stage transistors;
wherein the second stage is adapted to amplify and voltage limit the pair of first stage output voltage signals and to transmit the amplified and voltage limited pair of first stage output voltage signals as an output voltage signal from the active load output; and
wherein an output impedance of the second stage is a function of the active load impedance circuit.

10. The buffered limiting amplifier of claim 9,
wherein each of the pair of first stage transistors comprises a corresponding NPN BJT transistor, a base of the first of the pair of first stage transistors adapted to receive the input voltage signal;
wherein the first stage positive supply voltage network includes:
a pair of first stage supply resistors, a first terminal of each of the pair of first stage supply resistors electrically coupled to a collector of a corresponding one of the pair of first stage transistors;
a first stage shared resistor, a first terminal of the first stage shared resistor electrically coupled to the first terminal of a first of the pair of first stage supply resistors and a second terminal of the first stage shared resistor electrically coupled to the first terminal of a second of the pair of first stage supply resistors; and
wherein the first stage negative supply voltage network includes a first stage ground resistor, a first terminal of the first stage ground resistor electrically coupled to an emitter of each of the pair of first stage transistors.

11. The buffered limiting amplifier of claim 9,
wherein each of the pair of emitter-follower transistors comprises a corresponding PNP BJT transistor;
wherein the output buffer circuit further includes:
- a pair of output buffer circuit base resistors, a first terminal of each of the pair of output buffer circuit base resistors electrically coupled to a base of a corresponding one of the pair of emitter-follower transistors and a second terminal of each of the pair of output buffer circuit base resistors electrically coupled to a corresponding one of the pair of first stage transistors; and
- a pair of output buffer circuit supply resistors, a first terminal of each of the pair of output buffer circuit supply resistors electrically coupled to an emitter of a corresponding one of the pair of emitter-follower transistors;

wherein a first of the pair of first stage output voltage signals corresponds to a voltage at the emitter of a first of the pair of emitter-follower transistors; and
wherein a second of the pair of first stage output voltage signals corresponds to a voltage at the emitter of a second of the pair of emitter-follower transistors.

12. The buffered limiting amplifier of claim 9,
wherein the second stage negative supply voltage network includes:
- a pair of second stage coupling resistors, a first terminal of each of the pair of second stage coupling resistors electrically coupled together at a second stage node; and
- a second stage ground resistor, a first terminal of the second stage ground resistor electrically coupled to the second stage node;

wherein each of the pair of second stage transistors comprises a corresponding NPN BJT transistor;
wherein a base of each of the pair of second stage transistors is adapted to receive a corresponding one of the pair of first stage output voltage signals; and
wherein an emitter of each of the pair of second stage transistors is electrically coupled to a second terminal of a corresponding one of the pair of second stage coupling resistors.

13. The buffered limiting amplifier of claim 9,
wherein each of the pair of active load transistors comprises a corresponding PNP BJT transistor;
wherein a base of the first of the pair of active load transistors is electrically coupled to a base of a second of the pair of active load transistors;
wherein a collector of each of the pair of active load transistors is electrically coupled to a corresponding one of the pair of second stage transistors;
wherein the base of the second of the pair of active load transistors is electrically connected to the collector of the second of the pair of active load transistors;
wherein if the active load impedance circuit includes the active load feedback resistor, a first terminal of the active load feedback resistor is electrically coupled to the collector of the first of the pair of active load transistors and a second terminal of the active load feedback resistor is electrically coupled to the collector of the second of the pair of active load transistors;
wherein if the active load impedance circuit includes the active load ground resistor optionally in series with the active load ground capacitor, a first terminal of the active load ground resistor is electrically coupled to the collector of the first of the pair of active load transistors; and wherein the active load output is electrically connected to the collector of the first of the pair of active load transistors.

14. The buffered limiting amplifier of claim 9, further comprising:
- a monitor transistor comprising a PNP BJT transistor;
- a monitor supply resistor, a first terminal of the monitor supply resistor electrically coupled to an emitter of the monitor transistor;
- a monitor coupling resistor, a first terminal of the monitor coupling resistor electrically coupled to a second of the pair of first stage transistors and a second terminal of the monitor coupling resistor electrically coupled to a base of the monitor transistor; and
- a monitor capacitor, a first terminal of the monitor capacitor electrically coupled to the base of the monitor transistor;

wherein a monitor voltage signal corresponds to a voltage at the emitter of the monitor transistor, the monitor voltage indicative of an amplitude of the input voltage signal.

15. A dual channel sensor circuit for generating a down conversion signal, the dual channel sensor circuit comprising:
- a channel A limiting amplifier and a channel B limiting amplifier, each of the channel A and channel B limiting amplifiers including:
  - a first stage, the first stage adapted to receive a respective one of a channel A and a channel B input voltage signal, to amplify the respective channel A and channel B input voltage signal, and to transmit the respective amplified channel A and channel B input voltage signal as respective pairs of channel A and channel B first stage output voltage signals; and
  - a second stage for driving a respective one of a channel A sensor and a channel B sensor, the second stage including:
    - a pair of active load transistors; and
    - an active load impedance circuit, the active load impedance circuit including of an active load feedback resistor electrically coupled between the pair of active load transistors, or an active load ground resistor electrically coupled to a first of the pair of active load transistors, the active load ground resistor optionally in series with an active load ground capacitor;
  - wherein the second stage is adapted to receive a corresponding one of the pair of respective channel A and channel B first stage output voltage signals, to amplify and voltage limit the pair of respective channel A and channel B first stage output voltage signals, and to transmit the amplified and voltage limited pair of respective channel A and channel B first stage output voltage signals as respective channel A and channel B output voltage signals to drive the respective one of the channel A sensor and the channel B sensor, an output impedance of the second stage being a function of the active load impedance circuit;
- a channel A mixer including:
  - a channel A mixer buffer adapted to receive the pair of channel A first stage output voltage signals and to transmit a pair of channel A mixer buffer output voltage signals;

a channel A mixer second stage adapted to receive the pair of channel A mixer buffer output voltage signals, the channel A mixer second stage including:
- a pair of channel A mixer second stage active load transistors;
- a channel A mixer second stage active load impedance circuit, the channel A mixer second stage active load impedance circuit including a channel A mixer second stage active load feedback resistor electrically coupled between the pair of channel A mixer second stage active load transistors, or a channel A mixer second stage active load ground resistor electrically coupled to a first of the pair of channel A mixer second stage active load transistors;
- a channel A mixer second stage output electrically coupled to the first of the channel A mixer second stage active load transistors;
- a channel A mixer second stage mixing port; and
- an output filter electrically coupled to the channel A mixer second stage output;
- wherein the channel A mixer second stage is adapted to amplify and voltage limit the pair of channel A mixer buffer output voltage signals, to filter the amplified and voltage limited pair of channel A mixer buffer output voltage signals via the output filter, and to output the thus filtered amplified and voltage limited pair of channel A mixer buffer output voltage signals from an output filter output as the down conversion signal; and a channel B mixer stage including:
- a channel B mixer buffer adapted to receive the pair of channel B first stage output voltage signals and to transmit a pair of channel B mixer buffer output voltage signals;
- a channel B mixer second stage adapted to receive the pair of channel B mixer buffer output voltage signals; the channel B mixer second stage including a pair of channel B mixer second stage transistors;
- a channel B mixer second stage output electrically coupled to a first of the pair of channel B mixer second stage transistors; and
- a current mirror circuit electrically coupled to the channel B mixer second stage output and to the channel A mixer second stage mixing port;
- wherein the channel B mixer second stage is adapted to modulate the gain of the channel A mixer second stage via the current mirror circuit.

16. The dual channel sensor circuit of claim 15 further comprising:
- a channel A SAW resonator and a channel B SAW resonator, each of the channel A and channel B SAW resonators including:
  - a 2-port SAW resonator, a first port of the 2-port SAW resonator adapted to transmit a respective one of the channel A and channel B input voltage signals, a second port of the 2-port SAW resonator adapted to receive a respective one of the channel A and channel B output voltage signals; and
  - a recognition layer adapted to make the respective channel A and channel B SAW resonators sensitive to a target agent;
- wherein a magnitude of a frequency of the down conversion signal indicates at least one of a presence of a target agent and a quantity of the target agent.

17. The dual channel sensor circuit of claim 15,
wherein the first stage of each of the channel A and channel B limiting amplifiers includes:
- a pair of first stage transistors, a first of the pair of first stage transistors adapted to receive a respective one of the channel A and the channel B input voltage signal;
- a first stage positive supply voltage network electrically coupled to the pair of first stage transistors;
- a first stage negative supply voltage network electrically coupled to the pair of first stage transistors; and
- an output buffer circuit, the output buffer circuit including:
  - a pair of emitter-follower PNP BJT transistors, each of the pair of emitter-follower transistors electrically coupled to a corresponding one of the pair of first stage transistors;
  - a pair of buffer circuit base resistors, a first terminal of each of the pair of buffer circuit base resistors electrically coupled to a base of a corresponding one of the pair of emitter-follower transistors and a second terminal of each of the pair of buffer circuit base resistors electrically coupled to a corresponding one of the pair of first stage transistors;
  - a pair of buffer circuit supply resistors, a first terminal of each of the pair of buffer circuit supply resistors electrically coupled to an emitter of a corresponding one of the pair of emitter-follower transistors; and
  - a pair of first stage outputs, each of the pair of first stage outputs electrically coupled to a corresponding emitter of the emitter-follower transistors, each of the pair of first stage outputs adapted to transmit a corresponding one of the respective pairs of channel A and channel B first stage output voltage signals.

18. The dual channel sensor circuit of claim 15,
wherein each of the channel A and channel B second stages further includes a second stage negative supply voltage network, the second stage negative supply voltage network including:
- a pair of second stage coupling resistors, a first terminal of each of the pair of second stage coupling resistors electrically coupled together at a second stage node; and
- a second stage ground resistor, a first terminal of the second stage ground resistor electrically coupled to the second stage node;
wherein each of the pair of second stage transistors comprises a corresponding NPN BJT transistor;
wherein a base of each of the pair of second stage transistors is adapted to receive a corresponding one of the respective channel A and channel B pair of first stage output voltage signals; and
wherein an emitter of each of the pair of second stage transistors is electrically coupled to a second terminal of a corresponding one of the pair of second stage coupling resistors.

19. The dual channel sensor circuit of claim 15,
wherein the channel A mixer buffer includes:
- a mixer buffer positive supply voltage network;
- a pair of mixer buffer PNP BJT transistors, a corresponding emitter of each of the pair of mixer buffer PNP BJT transistors electrically coupled to the mixer buffer supply voltage network, a corresponding base of each of the pair of mixer buffer PNP BJT transistors electrically coupled to a corresponding one of the pair of channel A first stage output voltage signals, a corresponding collector of each of the pair of mixer buffer PNP BJT transistors transmitting respective ones of a pair of mixer buffer output signals; and a mixer buffer ground supply voltage network electrically coupled to the collectors of the pair of mixer buffer PNP BJT transistors;

wherein the channel A mixer second stage further includes:

a pair of mixer second stage transistors, each of the pair of mixer second stage transistors adapted to receive a corresponding one of the pair of mixer buffer output signals;

wherein each of the pair of channel A mixer second stage active load transistors are electrically coupled to a corresponding one of the pair of mixer second stage transistors;

wherein the output filter includes:

a first output filter resistor, a first terminal of the first output filter resistor electrically coupled to the mixer second stage output, and a second terminal of the first output filter resistor electrically coupled to the output filter output;

a first output filter capacitor, a first terminal of the first output filter capacitor electrically coupled to the first terminal of the first output filter resistor;

a second output filter capacitor, a first terminal of the second output filter capacitor electrically connected to the second terminal of the first output filter resistor;

a third output filter capacitor, a first terminal of the third output filter capacitor electrically connected to a second terminal of the second output filter capacitor; and a second output filter resistor, a first terminal of the second output filter resistor electrically connected to the second terminal of the second output filter capacitor.

20. The dual channel sensor circuit of claim 15, wherein the channel B mixer buffer includes:

a mixer buffer positive supply voltage network;

a pair of mixer buffer PNP BJT transistors, a corresponding emitter of each of the pair of mixer buffer PNP BJT transistors electrically coupled to the mixer buffer supply voltage network, a corresponding base of each of the pair of mixer buffer PNP BJT transistors electrically coupled to a corresponding one of the pair of channel B first stage output voltage signals, a corresponding collector of each of the pair of mixer buffer PNP BJT transistors transmitting respective ones of a pair of mixer buffer output signals; and a mixer buffer ground supply voltage network electrically coupled to the collectors of the pair of mixer buffer PNP BJT transistors;

wherein the channel B mixer second stage further includes:

a mixer second stage voltage supply network;

wherein each of the pair of channel B mixer second stage transistor comprises a corresponding mixer second stage PNP BJT transistor, a corresponding emitter of each of the pair of channel B mixer second stage transistors electrically coupled to the mixer second stage voltage supply network, a corresponding base of each of the pair of channel B mixer second stage transistors adapted to receive a corresponding one of the pair of mixer buffer output signals, the channel B mixer second stage output electrically coupled to a collector of the first of the pair of channel B mixer second stage transistors; and wherein the current mirror circuit includes:

a reference-side circuit, the reference-side circuit including a reference-side NPN BJT transistor in series with reference-side resistor; and an output-side circuit, the output-side circuit including an output-side NPN BJT transistor in series with an output-side resistor, the reference-side circuit and the output-side circuit being in parallel;

wherein a base of the reference-side NPN BJT transistor, a collector of the reference-side NPN BJT transistor, and a base of the output-side NPN BJT transistor are each adapted to receive the mixer second stage output signal, and a collector of the output-side NPN BJT transistor is electrically coupled to the channel A mixer second stage mixing port.

* * * * *